US009293500B2

(12) United States Patent  
Sharma et al.

(10) Patent No.: US 9,293,500 B2  
(45) Date of Patent: Mar. 22, 2016

(54) EXPOSURE CONTROL FOR IMAGE SENSORS

(71) Applicant: Apple Inc., Cupertino, CA (US)

(72) Inventors: Anup K. Sharma, Sunnyvale, CA (US); Xiaofeng Fan, San Jose, CA (US); Xiangli Li, San Jose, CA (US); Chung Chun Wan, San Jose, CA (US); Chiajen Lee, Irvine, CA (US); Terry L. Gilton, Boise, ID (US)

(73) Assignee: Apple Inc., Cupertino, CA (US)

( * ) Notice: Subject to any disclaimer, the term of this patent is extended or adjusted under 35 U.S.C. 154(b) by 17 days.

(21) Appl. No.: 13/782,532

(22) Filed: Mar. 1, 2013

(65) Prior Publication Data

US 2014/0247378 A1    Sep. 4, 2014

(51) Int. Cl.
| | |
|---|---|
| H04N 5/235 | (2006.01) |
| G03B 7/00 | (2014.01) |
| H01L 27/146 | (2006.01) |
| H04N 5/355 | (2011.01) |
| H04N 5/359 | (2011.01) |
| H04N 5/3745 | (2011.01) |

(52) U.S. Cl.
CPC ........ H01L 27/14641 (2013.01); H04N 5/3591 (2013.01); H04N 5/35536 (2013.01); H04N 5/37452 (2013.01)

(58) Field of Classification Search
None
See application file for complete search history.

(56) References Cited

U.S. PATENT DOCUMENTS

| | | | |
|---|---|---|---|
| 4,686,648 | A | 8/1987 | Fossum |
| 5,105,264 | A | 4/1992 | Erhardt et al. |
| 5,329,313 | A | 7/1994 | Keith |
| 5,396,893 | A | 3/1995 | Oberg et al. |
| 5,880,459 | A | 3/1999 | Pryor et al. |
| 6,040,568 | A | 3/2000 | Caulfield et al. |
| 6,233,013 | B1 | 5/2001 | Hosier et al. |
| 6,348,929 | B1 | 2/2002 | Acharya et al. |

(Continued)

FOREIGN PATENT DOCUMENTS

| | | |
|---|---|---|
| CN | 1842138 | 10/2006 |
| CN | 101189885 | 5/2008 |

(Continued)

OTHER PUBLICATIONS

Aoki et al., "Rolling-Shutter Distortion-Free 3D Stacked Image Sensor with -160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.

(Continued)

*Primary Examiner* — Aung S Moe  
*Assistant Examiner* — Euel Cowan  
(74) *Attorney, Agent, or Firm* — Brownstein Hyatt Farber Schreck, LLP

(57) ABSTRACT

A method of operating an image sensor. Charge accumulated in a photodiode during a first sub-exposure may be selectively stored in a storage node responsive to a first control signal. Charge accumulated in the photodiode during a first reset period may be selectively discarded responsive to a second control signal. Charge accumulated in the photodiode during a second sub-exposure may be selectively stored responsive to the first control signal. Charge stored in the storage node from the first and second sub-exposures may be transferred to a floating diffusion node responsive to a third control signal.

39 Claims, 11 Drawing Sheets

(56) References Cited

U.S. PATENT DOCUMENTS

| | | |
|---|---|---|
| 6,713,796 B1 | 3/2004 | Fox |
| 6,714,239 B2 | 3/2004 | Guidash |
| 6,798,453 B1 | 9/2004 | Kaifu |
| 6,816,676 B2 | 11/2004 | Bianchi et al. |
| 6,905,470 B2 | 6/2005 | Lee et al. |
| 6,982,759 B2 | 1/2006 | Goto |
| 7,091,466 B2 | 8/2006 | Bock |
| 7,259,413 B2 | 8/2007 | Rhodes |
| 7,262,401 B2 | 8/2007 | Hopper et al. |
| 7,271,835 B2 | 9/2007 | Iizuka |
| 7,282,028 B2 | 10/2007 | Kim et al. |
| 7,332,786 B2 | 2/2008 | Altice |
| 7,390,687 B2 | 6/2008 | Boettiger |
| 7,437,013 B2 | 10/2008 | Anderson |
| 7,443,421 B2 | 10/2008 | Stavely et al. |
| 7,502,054 B2 | 3/2009 | Kalapathy |
| 7,525,168 B2 | 4/2009 | Hsieh |
| 7,554,067 B2 | 6/2009 | Zarnoski et al. |
| 7,555,158 B2 | 6/2009 | Lee |
| 7,671,435 B2 | 3/2010 | Ahn |
| 7,728,351 B2 | 6/2010 | Shim |
| 7,733,402 B2 | 6/2010 | Egawa et al. |
| 7,742,090 B2 | 6/2010 | Street |
| 7,773,138 B2 | 8/2010 | Lahav et al. |
| 7,796,171 B2 | 9/2010 | Gardner |
| 7,873,236 B2 | 1/2011 | Li et al. |
| 7,884,402 B2 | 2/2011 | Ki |
| 7,906,826 B2 | 3/2011 | Martin et al. |
| 7,952,121 B2 | 5/2011 | Arimoto |
| 7,952,635 B2 | 5/2011 | Lauxtermann |
| 8,032,206 B1 | 10/2011 | Farazi et al. |
| 8,089,524 B2 | 1/2012 | Urisaka |
| 8,094,232 B2 | 1/2012 | Kusaka |
| 8,140,143 B2 | 3/2012 | Picard et al. |
| 8,153,947 B2 | 4/2012 | Barbier et al. |
| 8,159,588 B2 | 4/2012 | Boemler |
| 8,184,188 B2 | 5/2012 | Yaghmai |
| 8,194,148 B2 | 6/2012 | Doida |
| 8,194,165 B2 | 6/2012 | Border et al. |
| 8,227,844 B2 | 7/2012 | Adkisson |
| 8,233,071 B2 | 7/2012 | Takeda |
| 8,259,228 B2 | 9/2012 | Wei et al. |
| 8,310,577 B1 | 11/2012 | Neter |
| 8,324,553 B2 | 12/2012 | Lee |
| 8,340,407 B2 | 12/2012 | Kalman |
| 8,350,940 B2 | 1/2013 | Smith et al. |
| 8,400,546 B2 | 3/2013 | Itano et al. |
| 8,456,559 B2 | 6/2013 | Yamashita |
| 8,508,637 B2 | 8/2013 | Han et al. |
| 8,514,308 B2 | 8/2013 | Itonaga et al. |
| 8,547,388 B2 | 10/2013 | Cheng |
| 8,619,163 B2 | 12/2013 | Ogua |
| 8,629,484 B2 | 1/2014 | Ohri et al. |
| 8,634,002 B2 | 1/2014 | Kita |
| 8,648,947 B2 | 2/2014 | Sato et al. |
| 8,723,975 B2 | 5/2014 | Solhusvik |
| 8,754,983 B2 | 6/2014 | Sutton |
| 8,755,854 B2 | 6/2014 | Addison et al. |
| 8,803,990 B2 | 8/2014 | Smith |
| 8,817,154 B2 | 8/2014 | Manabe et al. |
| 8,902,330 B2 | 12/2014 | Theuwissen |
| 8,908,073 B2 | 12/2014 | Minagawa |
| 8,934,030 B2 | 1/2015 | Kim et al. |
| 8,946,610 B2 | 2/2015 | Iwabuchi et al. |
| 8,982,237 B2 | 3/2015 | Chen |
| 9,054,009 B2 | 6/2015 | Oike et al. |
| 9,066,017 B2 | 6/2015 | Geiss |
| 9,066,660 B2 | 6/2015 | Watson et al. |
| 9,088,727 B2 | 7/2015 | Trumbo |
| 9,099,604 B2 | 8/2015 | Roy |
| 9,100,597 B2 | 8/2015 | Hu |
| 9,131,171 B2 | 9/2015 | Aoki et al. |
| 9,232,150 B2 | 1/2016 | Kleekajai et al. |
| 2003/0036685 A1 | 2/2003 | Goodman et al. |
| 2004/0207836 A1 | 10/2004 | Chhibber et al. |
| 2006/0017829 A1* | 1/2006 | Gallagher ............... 348/276 |
| 2006/0274161 A1 | 12/2006 | Ing et al. |
| 2007/0165123 A1* | 7/2007 | Panicacci ............... 348/294 |
| 2007/0263099 A1 | 11/2007 | Motta et al. |
| 2008/0055441 A1* | 3/2008 | Altice ............... 348/297 |
| 2008/0177162 A1 | 7/2008 | Bae et al. |
| 2008/0315198 A1 | 12/2008 | Jung |
| 2009/0096901 A1 | 4/2009 | Bae et al. |
| 2009/0101914 A1 | 4/2009 | Hirotsu et al. |
| 2009/0201400 A1 | 8/2009 | Zhang et al. |
| 2010/0134631 A1 | 6/2010 | Voth |
| 2011/0028802 A1 | 2/2011 | Addison et al. |
| 2011/0080500 A1* | 4/2011 | Wang et al. ............... 348/231.3 |
| 2011/0156197 A1 | 6/2011 | Tivarus et al. |
| 2011/0205415 A1 | 8/2011 | Makino et al. |
| 2011/0245690 A1 | 10/2011 | Watson et al. |
| 2011/0279693 A1* | 11/2011 | Hamada ............... 348/208.4 |
| 2012/0092541 A1 | 4/2012 | Tuulos et al. |
| 2012/0098964 A1 | 4/2012 | Oggier et al. |
| 2012/0153125 A1 | 6/2012 | Oike et al. |
| 2013/0147981 A1 | 6/2013 | Wu |
| 2013/0155271 A1 | 6/2013 | Ishii |
| 2014/0004644 A1 | 1/2014 | Roy |
| 2014/0049683 A1 | 2/2014 | Guenter |
| 2014/0071321 A1 | 3/2014 | Seyama |
| 2014/0240550 A1 | 8/2014 | Taniguchi |
| 2014/0246568 A1 | 9/2014 | Wan |
| 2014/0253754 A1 | 9/2014 | Papiashvili |
| 2014/0253768 A1 | 9/2014 | Li |
| 2014/0263951 A1 | 9/2014 | Fan et al. |
| 2014/0267855 A1 | 9/2014 | Fan |
| 2014/0347533 A1 | 11/2014 | Toyoda |
| 2014/0354861 A1 | 12/2014 | Pang |
| 2015/0163392 A1 | 6/2015 | Malone et al. |
| 2015/0163422 A1 | 6/2015 | Fan et al. |
| 2015/0237314 A1 | 8/2015 | Hasegawa |
| 2015/0264241 A1 | 9/2015 | Kleekajai et al. |
| 2015/0264278 A1 | 9/2015 | Kleekajai et al. |
| 2015/0312479 A1 | 10/2015 | McMahon et al. |
| 2015/0350575 A1 | 12/2015 | Agranov et al. |

FOREIGN PATENT DOCUMENTS

| | | |
|---|---|---|
| CN | 101233763 | 7/2008 |
| CN | 101472059 | 7/2009 |
| CN | 101567977 | 10/2009 |
| CN | 101622859 | 1/2010 |
| CN | 101803925 | 8/2010 |
| CN | 102036020 | 4/2011 |
| CN | 102821255 | 12/2012 |
| CN | 103329513 | 9/2013 |
| CN | 103546702 | 1/2014 |
| EP | 2023611 | 2/2009 |
| EP | 2107610 | 10/2009 |
| EP | 2230690 | 9/2010 |
| JP | 201149697 | 3/2011 |
| KR | 20030034424 | 5/2003 |
| KR | 20030061157 | 7/2003 |
| KR | 2008/0069851 | 7/2008 |
| KR | 20100008239 | 1/2010 |
| KR | 20100065084 | 6/2010 |
| KR | 20130074459 | 7/2013 |
| TW | 201301881 | 1/2013 |
| WO | WO 2010/120945 | 10/2010 |
| WO | WO 2012/053363 | 4/2012 |
| WO | WO 2012/088338 | 6/2012 |
| WO | WO 2012/122572 | 9/2012 |
| WO | WO 2013/008425 | 1/2013 |
| WO | WO 2013/179018 | 12/2013 |
| WO | WO 2013/179020 | 12/2013 |

OTHER PUBLICATIONS

U.S. Appl. No. 14/207,150, Mar. 12, 2014, Kleekajai et al.
U.S. Appl. No. 14/207,176, Mar. 12, 2014, Kleekajai et al.
U.S. Appl. No. 14/276,728, May 13, 2014, McMahon et al.
U.S. Appl. No. 14/292,599, May 30, 2014, Agranov et al.

(56) References Cited

OTHER PUBLICATIONS

Feng, et al., "On the Stoney Formula for a Thin Film/Substrate System with Nonuniform Substrate Thickness," Journal of Applied Mechanics, Transactions of the ASME, vol. 74, Nov. 2007, pp. 1276-1281.
Schwarzer, et al., On the determination of film stress from substrate bending: Stoney'S formula and its limits, Jan. 2006, 17 pages.
Invitation to Pay Additional Fees and Partial Search Report dated May 23, 2014, PCT/US2014/017116, 6 pages.
International Search Report and Written Opinion dated Jul. 25, 2014, PCT/US2014/017116, 15 pages.
U.S. Appl. No. 13/783,536, Mar. 4, 2013, Wan.
U.S. Appl. No. 13/785,070, Mar. 5, 2013, Li.
U.S. Appl. No. 13/787,094, Mar. 6, 2013, Li et al.
U.S. Appl. No. 13/797,851, Mar. 12, 2013, Fan et al.
U.S. Appl. No. 13/830,748, Mar. 14, 2013, Fan.
U.S. Appl. No. 14/098,504, Dec. 5, 2013, Fan et al.
U.S. Appl. No. 14/462,032, Aug. 18, 2014, Jiang et al.
Elgendi, "On the Analysis of Fingertip Photoplethysmogram Signals," Current Cardiology Reviews, 2012, vol. 8, pp. 14-25.
Fu, et al., "Heart Rate Extraction from Photoplethysmogram Waveform Using Wavelet Multui-resolution Analysis," Journal of Medical and Biological Engineering, 2008, vol. 28, No. 4, pp. 229-232.
Han, et al., "Artifacts in wearable photoplethysmographs during daily life motions and their reduction with least mean square based active noise cancellation method," Computers in Biology and Medicine, 2012, vol. 42, pp. 387-393.
Lopez-Silva, et al., "Heuristic Algorithm for Photoplethysmographic Heart Rate Tracking During Maximal Exercise Test," Journal of Medical and Biological Engineering, 2011, vol. 12, No. 3, pp. 181-188.
Santos, et al., "Accelerometer-assisted PPG Measurement During Physical Exercise Using the LAVIMO Sensor System," Acta Polytechnica, 2012, vol. 52, No. 5, pp. 80-85.
Sarkar, et al., "Fingertip Pulse Wave (PPG signal) Analysis and Heart Rate Detection," International Journal of Emerging Technology and Advanced Engineering, 2012, vol. 2, No. 9, pp. 404-407.
Schwarzer, et al., On the determination of film stress from substrate bending: Stoney's formula and its limits, Jan. 2006, 19 pages.
Yan, et al., "Reduction of motion artifact in pulse oximetry by smoothed pseudo Wigner-Ville distribution," Journal of NeuroEngineering and Rehabilitation, 2005, vol. 2, No. 3, pp. 1-9.
Yousefi, et al., "Adaptive Cancellation of Motion Artifact in Wearable Biosensors," 34th Annual International Conference of the IEEE EMBS, San Diego, California, Aug./Sep., 2012, pp. 2004-2008.
U.S. Appl. No. 14/481,806, filed Sep. 9, 2014, Kleekajai et al.
U.S. Appl. No. 14/481,820, filed Sep. 9, 2014, Lin et al.
U.S. Appl. No. 14/501,429, filed Sep. 30, 2014, Malone et al.
U.S. Appl. No. 14/503,322, filed Sep. 30, 2014, Molgaard.
U.S. Appl. No. 14/569,346, filed Dec. 12, 2014, Kestelli et al.
U.S. Appl. No. 14/611,917, filed Feb. 2, 2015, Lee et al.

\* cited by examiner

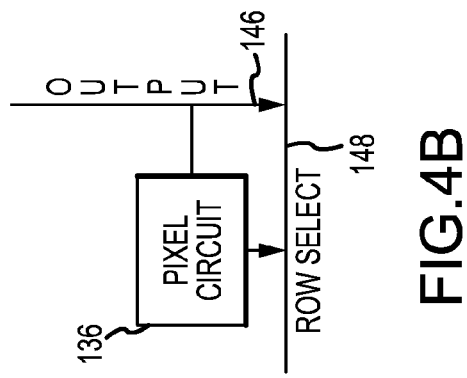
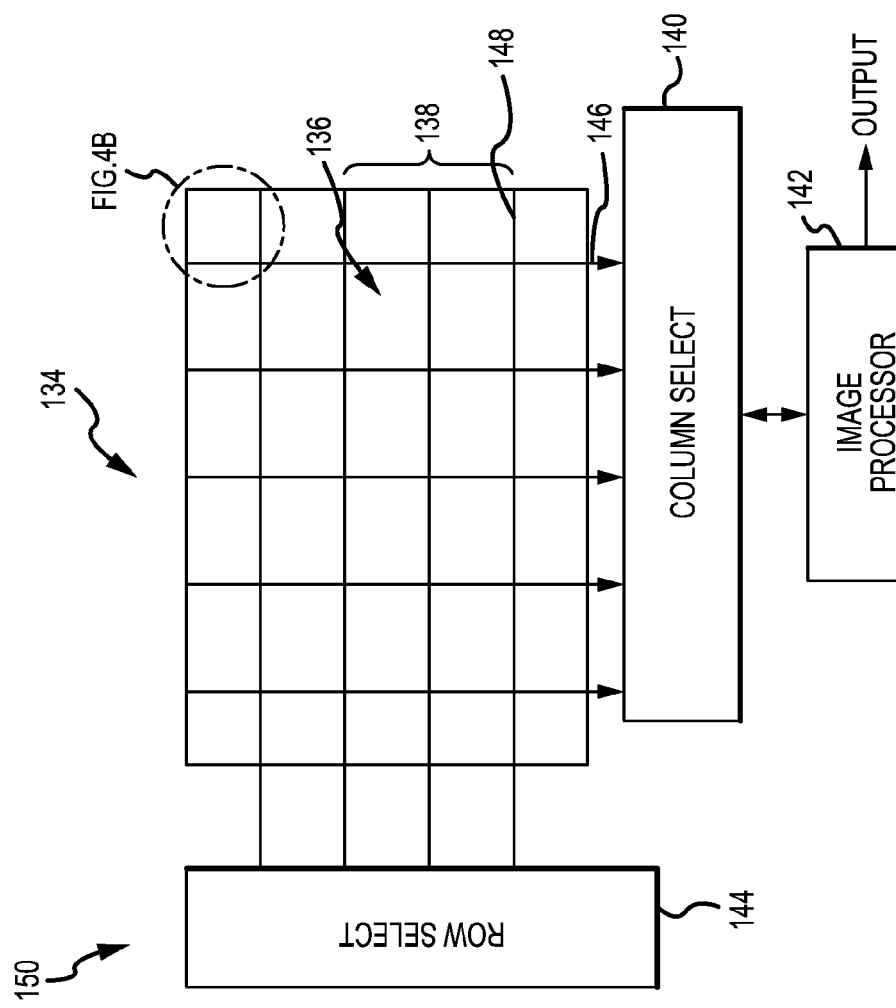

EXPOSURE CONTROL FOR IMAGE SENSORS

TECHNICAL FIELD

The present invention relates generally to image sensors, and, more specifically, to exposure control in image sensors.

BACKGROUND

Electronic image sensors such as charge coupled devices (CCDs) and complementary metal oxide semiconductor (CMOS) sensors typically include one or more photodiodes for each pixel that, when exposed to light, accumulate electrical charge in proportion to the brightness of the light incident on the photodiode of the pixel. Some electronic image sensors are used with mechanical shutters to help control the duration of time that the photodiodes are exposed to a light source, whereas other electronic image sensors (including certain of those on, for example, cell phones, tablet computers, and other electronic devices) are not used with a mechanical shutter and hence rely on some form of electrical shuttering to control the charge generated in the photodiodes when exposed to light.

One way in which electrical shuttering can be implemented is by controlling gates (e.g., transistors) that couple the photodiode to other parts of the sensor. For example, gates coupled to the photodiode may continuously drain away any charge generated in the photodiode when no image is to be captured by the sensor. Controlling the flow of charge generated in the photodiode may generally be referred to as exposure control because it controls the effective exposure of the photodiode, even though without a mechanical shutter, the sensor may constantly be exposed to light. In other words, because of the difficulty of mechanically controlling exposure of photodiodes, the effective exposure of some electronic image sensors may be controlled by selectively accumulating and selectively discarding charge generated by incident photons in those areas.

It can be useful to control exposure of pixels in an image sensor based on different lighting and color conditions of a particular scene to be imaged. For example, in a bright light situation, the exposure time of pixels on the sensor may be reduced to avoid saturating the wells of the photodiodes of the pixels (which, if not corrected, may lead to blooming). Conversely, in a low light situation, the exposure time may be increased in order to allow sufficient charge to collect in the pixel to maintain a sufficient signal-to-noise ratio. However, changing exposure times may be challenging for several reasons, particularly for image sensors that capture video at a set frame rate and thus have limited amount of time within which to expand exposure time. Continuing with the video example, on one hand, if the exposure time is shortened too severely within each video frame, severe motion artifacts may occur between frames of the video causing aliasing or a stroboscopic effect between frames. If, on the other hand, exposure time is lengthened too much, pixels may saturate, and may even bloom into adjacent pixels.

Color image sensors typically include some type of color filter array (CFA), such as a Bayer pattern having a red-green-blue-green (RGBG) arrangement of pixels. For a Bayer pattern, the pixels of the image sensor may be arranged into groups of 2×2 sub-arrays, with each 2×2 sub-array including one red pixel and one green pixel in one row, and one blue pixel and one green pixel in the other row. In such an arrangement, the two green pixels are generally located diagonally from one another in the 2×2 sub-array. Usually, all four pixels in each 2×2 sub-array are identical other than a color filter placed over the top of the pixel; in other words, the pixels usually have photodiodes with similar well capacity. However, the color filters cause different wavelengths of light to be detected by the different color pixels. The sensitivity of the photodiodes of the pixels to incident photons may, however, vary based on the wavelength of light incident thereon, and so different colored pixels may have different sensitivities to identical brightness of different colors of light. For example, in the Bayer pattern, the green pixels are usually the most sensitive. Because the green pixels are the most sensitive, the green photodiodes will typically fill up with charge faster than the red and blue photodiodes for most neutral color scenes to which the image sensor is exposed.

Recently there has been interest in adding a clear pixel, which may not have a colored filter placed over the top of it. The clear pixel is also known as a "white pixel." Adding clear pixels to an image sensor may provide a higher luminance sensitivity and wider overall spectrum for the image sensor. However, the clear pixel is usually more sensitive than any of the red, green, or blue pixels to incident light, and thus the clear pixel typically saturates faster than any of the other color pixels.

One technique to help prevent image sensor pixels from saturating and potentially spilling accumulated charge over into adjacent pixels (a phenomenon known as blooming) is to drain excess charge away from the photodiodes using a form of anti-blooming control.

In most image sensors today, exposure control and anti-blooming are applied in a generally uniform manner. For example, most image sensors set a single, common exposure time for all of the different colors of pixels, and the exposure time is a continuous block of time. The exposure time is generally chosen responsive to the most sensitive color channel, with the exposure time being shorter than the time during which the most sensitive color pixels are expected to saturate with accumulated charge. However, cutting short the effective exposures of the other, less-sensitive color pixels may cause less than optimal results (possibly with low signal to noise ratios for those colors, as signal to noise ratio is generally related to the amount of charge accumulated in the photodiode). Furthermore, the uniform application of anti-blooming control among all of the different colors of pixels also prevents more fine-tuned blooming mitigation techniques from being applied.

SUMMARY

One example of the present disclosure may take the form of a method of operating an image sensor. The method may include selectively storing, responsive to a first control signal, charge accumulated in a photodiode during a first sub-exposure in a storage node, and selectively discarding, responsive to a second control signal, charge accumulated in the photodiode during a first reset. The method may also include selectively storing, responsive to the first control signal, charge accumulated in the photodiode during a second sub-exposure in the storage node, and transferring, responsive to a third signal, charge stored in the storage node from the first and second sub-exposures to a floating diffusion node.

Another example of the disclosure may take the form of an image sensor pixel that includes a photodiode, a storage node, and a storage gate coupled between the photodiode and storage node with the storage gate selectively receiving an exposure control signal and being responsive thereto. The image sensor pixel may also include a floating diffusion node and a transfer gate coupled between the storage node and floating diffusion node with the transfer gate selectively receiving a transfer control signal and being responsive thereto. The image sensor pixel may also include control circuitry configured to provide the exposure control signal to the storage gate such that the charge accumulated in the photodiode during a plurality of sub-exposures is transferred to the storage node after or during each sub-exposure, the control circuitry further configured to provide the transfer signal to the transfer gate following the plurality of sub-exposures such that charge stored in the storage node is transferred to the floating diffusion node.

Another example of the present disclosure may take the form of a method of operating an image sensor. The method may include selectively accumulating charge in a first photodiode associated with a first color channel during a first period of time responsive to a first exposure control signal. The method may also include selectively accumulating charge in a second photodiode associated with a second color channel during a second period of time responsive to a second exposure control signal. The first color channel may be different than the second color channel and the first period of time may be shorter than the second period of time, with the first and second periods of time being at least partially contemporaneous with each other.

Another example of the present disclosure may take the form of an image sensor. The image sensor may include a first pixel associated with a first color channel and configured to accumulate charge for a first period of time responsive to a first control signal. The image sensor may also include a second pixel associated with a second color channel and configured to accumulate charge for a second period of time responsive to a second control signal. The first color channel may be different than the second color channel and the first period of time may be shorter than the second period of time.

Another example of the present disclosure may take the form of a method of operating an image sensor. The method may include selectively accumulating charge in a first photodiode associated with a first color channel during a first plurality of sub-exposures. The method may also include selectively transferring, responsive to a first control signal, charge accumulated in the first photodiode during each of the first plurality of sub-exposures to a first node. The method may also include selectively accumulating charge in a second photodiode associated with a second color channel during a second plurality of sub-exposures. The method may also include selectively transferring, responsive to a second control signal, charge accumulated in the first photodiode during each of the second plurality of sub-exposures to a second node. The first color channel may be different than the second color channel and at least one of the first plurality of sub-exposures may be shorter than at least one of the second plurality of sub-exposures. The first and second plurality of exposures may be at least partially contemporaneous.

Another example of the present disclosure may take the form of a method of operating an image sensor. The method may include partitioning a first exposure of a first pixel associated with a first color channel into a first plurality of sub-exposures, each of the first plurality of sub-exposures having a respective duration. The method may also include partitioning a second exposure of a second pixel associated with a second color channel into a second plurality of sub-exposures, each of the second plurality of sub-exposures having a respective duration. The duration of at least one of the first plurality of sub-exposures may be shorter than at least one of the second plurality of sub-exposures.

BRIEF DESCRIPTION OF THE DRAWINGS

FIG. 4A is a simplified diagram of an image sensor architecture for a camera of the electronic device.

FIG. 4B is an enlarged view of a pixel architecture of FIG. 4A illustrating a single pixel.

SPECIFICATION

Overview

In some embodiments herein, apparatuses and methods for controlling effective exposure in electronic image sensors are disclosed. In one embodiment, the overall effective exposure for one or more frames may be divided or partitioned into a plurality of sub-exposures. In another embodiment, the effective exposure of photodiodes in a color filter array may be varied among the different color channels of the array. In still another embodiment, the overall effective exposure for one or more frames may be divided or partitioned into a plurality of sub-exposures for pixels in one or more color channels, with the sub-exposures between the different color channels having different durations.

Figure 1A:
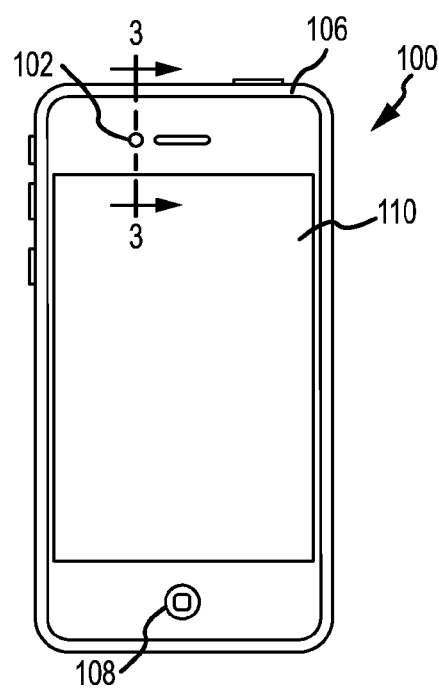
FIG. 1A is a front perspective view of an electronic device including one or more cameras.
Figure 1B:
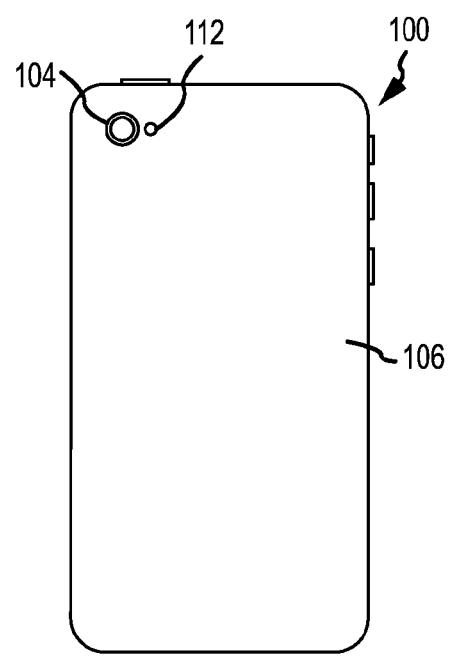
FIG. 1B is a rear perspective view of the electronic device of FIG. 1A.

Turning now to the figures, the image sensor and an illustrative electronic device for incorporating the image sensor will be discussed in more detail. FIG. 1A is a front elevation view of an electronic device 100 including the image sensor. FIG. 1B is a rear elevation view of the electronic device 100. The electronic device 100 may include any or all of a first camera 102, a second camera 104, an enclosure 106, a display 110, and an input/output button 108. The electronic device 100 may be substantially any type of electronic or computing device, such as, but not limited to, a computer, a laptop, a tablet, a smart phone, a digital camera, a printer, a scanner, a copier, or the like. The electronic device 100 may also include one or more internal components (not shown) typical of a computing or electronic device, such as, but not limited to, one or more processors, memory components, network interfaces, and so on. Examples of such internal components will be discussed with respect to FIG. 2.

As shown in FIG. 1, the enclosure 106 may form an outer surface and protective case for the internal components of the electronic device 100 and may at least partially surround the display 110. The enclosure 106 may be formed of one or more components operably connected together, such as a front piece and a back piece, or may be formed of a single piece operably connected to the display 110.

The input member 108 (which may be a switch, button, capacitive sensor, or other input mechanism) allows a user to interact with the electronic device 100. For example, the input member 108 may be a button or switch to alter the volume, return to a home screen, and the like. The electronic device 100 may include one or more input members 108 and/or output members, and each member may have a single input or output function or multiple input/output functions.

The display 110 may be operably connected to the electronic device 100 or may be communicatively coupled thereto. The display 110 may provide a visual output for the electronic device 100 and/or may function to receive user inputs to the electronic device 100. For example, the display 110 may be a multi-touch capacitive sensing screen that may detect one or more user inputs.

Figure 2:
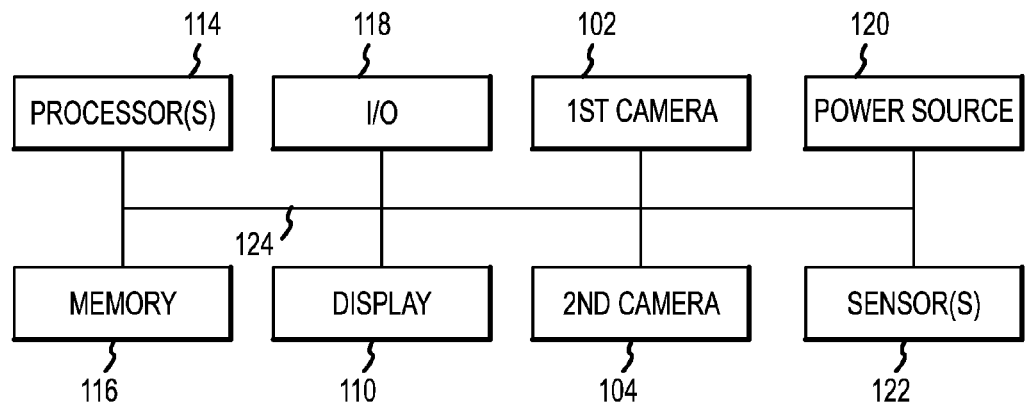
FIG. 2 is a simplified block diagram of the electronic device of FIG. 1A.

The electronic device 100 may also include a number of internal components. FIG. 2 is a simplified block diagram of the electronic device 100. The electronic device 100 may also include one or more processors 114, a storage or memory component 116, an input/output interface 118, a power source 120, and one or more sensors 122, each will be discussed in turn below.

The processor 114 may control operation of the electronic device 100. The processor 114 may be in communication, either directly or indirectly, with substantially all of the components of the electronic device 100. For example, one or more system buses 124 or other communication mechanisms may provide communication between the processor 114, the cameras 102, 104, the display 110, the input member 108, the sensors 122, and so on. The processor 114 may be any electronic device cable of processing, receiving, and/or transmitting instructions. For example, the processor 114 may be a microprocessor or a microcomputer. As described herein, the term "processor" is meant to encompass a single processor or processing unit, multiple processors, or multiple processing units, or other suitably configured computing element.

The memory 116 may store electronic data that may be utilized by the electronic device 100. For example, the memory 116 may store electrical data or content e.g., audio files, video files, document files, and so on, corresponding to various applications. The memory 116 may be, for example, non-volatile storage, a magnetic storage medium, optical storage medium, magneto-optical storage medium, read only memory, random access memory, erasable programmable memory, or flash memory.

The input/output interface 118 may receive data from a user or one or more other electronic devices. Additionally, the input/output interface 118 may facilitate transmission of data to a user or to other electronic devices. For example, in embodiments where the electronic device 100 is a phone, the input/output interface 118 may be used to receive data from a network, or may be used to send and transmit electronic signals via a wireless or wired connection (Internet, WiFi, Bluetooth, and Ethernet being a few examples). In some embodiments, the input/output interface 118 may support multiple network or communication mechanisms. For example, the network/communication interface 118 may pair with another device over a Bluetooth network to transfer signals to the other device, while simultaneously receiving data from a WiFi or other network.

The power source 120 may be substantially any device capable of providing energy to the electronic device 100. For example, the power source 120 may be a battery, a connection cable that may be configured to connect the electronic device 100 to another power source such as a wall outlet, or the like.

The sensors 122 may include substantially any type of sensor. For example, the electronic device 100 may include one or more audio sensors (e.g., microphones), light sensors (e.g., ambient light sensors), gyroscopes, accelerometers, or the like. The sensors 122 may be used to provide data to the processor 114, which may be used to enhance or vary functions of the electronic device 100.

Figure 3:
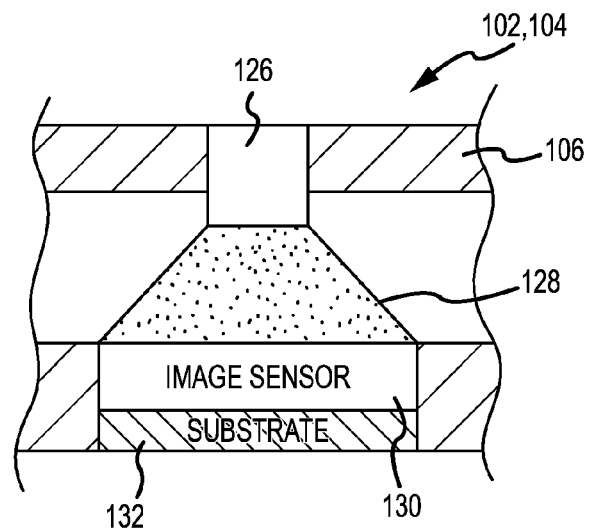
FIG. 3 is a simplified schematic cross-section view of the electronic device of FIG. 1A taken along line 3-3 in FIG. 1A.

With reference again to FIGS. 1A and 1B, the electronic device 100 may also include one or more cameras 102, 104 and optionally a flash 112 or light source for the cameras 102, 104. FIG. 3 is a simplified cross-section view of the first camera 102, taken along line 3-3 in FIG. 1A. Although FIG. 3 illustrates the first camera 102, it should be noted that the second camera 104 may be substantially similar to the first camera 102. In some embodiments, one camera may include a global shutter configured image sensor and one camera may include a rolling shutter configured image sensor. In other examples, one camera may have an image sensor with a higher resolution than the other. Likewise, it should be appreciated that the structure shown in FIG. 3 is but one possible structure for either of the first and second cameras.

With reference to FIG. 3, the cameras 102, 104 may include a lens 126 in optical communication with an image sensor 130. The lens 126 may be operably connected to the enclosure 106 and positioned above the image sensor 130. The lens 126 may direct or transmit light 128 within its field of view on to a photodiode layer (discussed in more detail below) of the image sensor 130.

The image sensor 130 may be supported beneath the lens 126 by a substrate 132 or other support structure. The image sensor 130 may convert light 128 into electrical signals that may represent the light from the captured scene. In other words, the image sensor 130 captures the light 128 optically transmitted via the lens 126 into electrical signals.

Image Sensor Architecture

Figure 5:
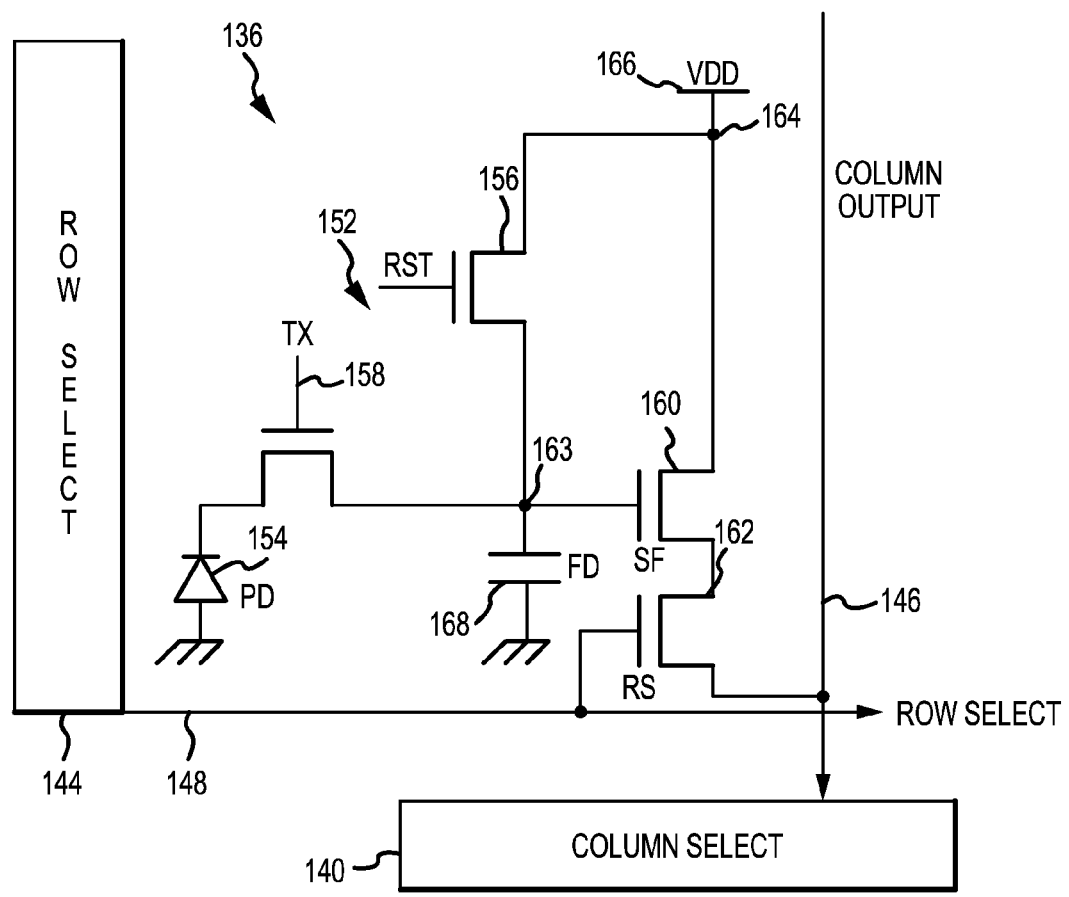
FIG. 5 is a simplified schematic view of a pixel cell having a rolling shutter operation.

An illustrative architecture for the image sensor 130 will now be discussed in more detail. FIG. 4A is a simplified schematic of one possible architecture for the image sensor 130. FIG. 4B is an enlarged view of a pixel of the pixel architecture of FIG. 4A. FIG. 5 is a simplified schematic view of the pixel of FIG. 4A. With reference to FIGS. 4A-5, the electronic device 100 may include an image processing component having a pixel architecture defining one or more pixels 136 and/or groups of pixel cells 138 (e.g., groups of pixels 136 grouped together to form a Bayer pixel or other set of pixels). The pixel architecture 134 may be in communication with a column select 140 through one or more column output lines 146 and a row select 144 through one or more row select lines 148.

The row select 144 and/or the column select 140 may be in communication with an image processor 142. The image processor 142 may process data from the pixels 136 and provide that data to the processor 114 and/or other components of the electronic device 100. It should be noted that in some embodiments, the image processor 142 may be incorporated into the processor 114 or separate therefrom. The row select 144 may selectively activate a particular pixel 136 or group of pixels, such as all of the pixels 136 on a certain row. The column select 140 may selectively receive the data output from select pixels 136 or groups of pixels 136 (e.g., all of the pixels with a particular column).

With reference to FIG. 5, each pixel 136 may include a transistor array 152 or control circuitry and a photodiode 154. The photodiode 154 may be in optical communication with the lens 126 to receive light transmitted therethrough. The photodiode 154 may absorb light and convert the absorbed light into an electrical signal. The photodiode 154 may be an electron-based photodiode or a hole-based photodiode. Additionally, it should be noted that the term "photodiode," as used herein, is meant to encompass substantially any type of photon or light detecting component, such as a photogate or other photo-sensitive region. The photodiode 154 is coupled to a transfer gate 158, which selectively connects the photodiode 154 to the remaining control circuitry 152 of the pixel 136.

The transfer gate 158 is coupled to a reset gate 156 and a source follower (SF) gate 160. A reset gate 162 and the SF gate 160 are coupled to a reference voltage node 164 which connects the two gates to a reference voltage source (Vdd) 166. The row select gate 162 is coupled to a row select line 148 for the pixel 136. A floating diffusion (FD) node 163, including a charge storage component 168, may be coupled between the transfer gate 158 and the reset gate 156 and SF gate 160. The control circuitry 152 (one example of which is the aforementioned transistor array) may include additional gates other than those shown in FIG. 5. For example, an anti-blooming gate may be in communication with the photodiode 154 to drain excess charge over saturation from the photodiode.

Generally, in operation, when one of the cameras 102, 104 is actuated to capture an image, the reference voltage 166 is applied to the reset gate 156 and the transfer gate 158. When the transfer gate 158 is open, the charge within the photodiode 154 is drained to deplete the photodiode. In some embodiments, the cameras 102, 104 may not include a shutter over the lens 126, and so the image sensor 130 may be constantly exposed to light. In these embodiments, the photodiode 154 may have to be reset or depleted before a desired image is to be captured. Once the charge from the photodiode 154 has been depleted, the transfer gate 158 and the reset gate 156 may be turned off, isolating the photodiode 154. The photodiode 154 may then begin integrating and collecting light 128 transmitted to the image sensor 130 from the lens 126. As the photodiode 154 receives light, it starts to collect charge (e.g., a depletion region reduces as electrons from the light are received). However, the charge within the photodiode 154 may remain within a well of the photodiode 154 because the transfer gate 158 (connecting the photodiode 154) to the control circuitry 150 and other gates is off.

Once integration is complete and the photodiode 154 has collected light 128 from the lens 126, the reset gate 126 may be turned on to reset the floating diffusion node 163. Once the floating diffusion 162 has been reset, the reset gate 156 may be turned off and the transfer gate 158 may be turned on. The charge from the photodiode 154 can then be transferred to the floating diffusion node 163 and stored in the storage component 168. To read out the charge from the photodiode 154 (via the floating diffusion 163), the row select gate 152 and the SF gate 160 may be activated, and the SF gate 160 amplifies the charge within the floating diffusion 163 and through the row select gate 162, the signal or charge is provided to the column output line 146.

In a rolling shutter operation, the photodiodes 154 in different rows may be exposed at different times. Accordingly, if one or more objects within a scene are moving, a first row may capture a different position of the image than a second row, as they are exposed sequentially, which may cause motion artifacts in the sensed image. In a global shutter operation, additional storage gates may be added to store charge from the photodiode 154. In the global shutter operation, each row within the pixel architecture 134 may be reset and exposed at substantially the same time. Each storage node may also simultaneously transfer the charge from the photodiode 154 to a storage node, and then each pixel 136 may be read out row by row. Some embodiments may implement a rolling shutter architecture on a column basis, with appropriate changes to the associated circuitries.

Figure 6:
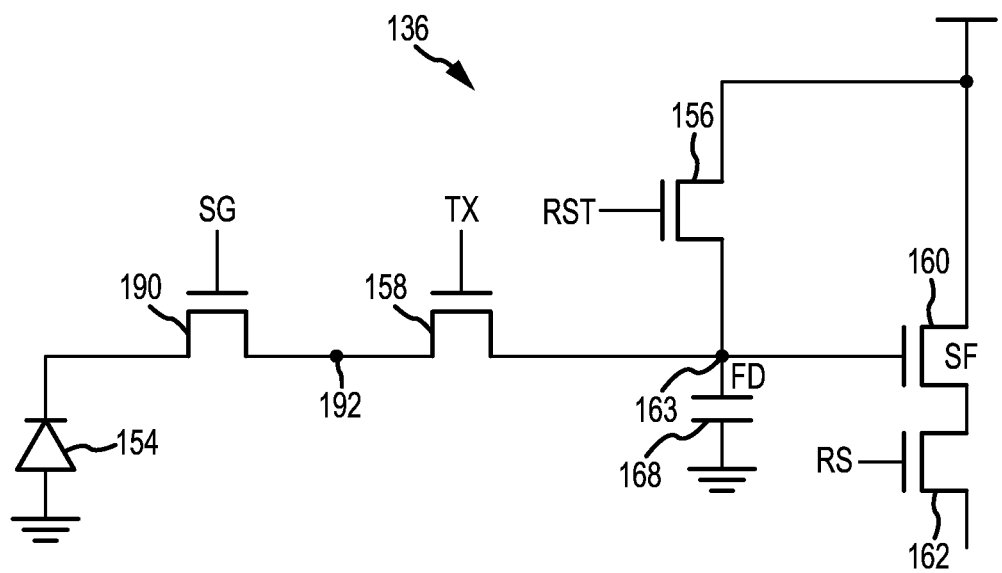
FIG. 6 is a simplified schematic view of a pixel cell having a global shutter configuration.

With reference now to FIG. 6, in some embodiments, the image sensor 130 may include one or more global shutter pixels 136. FIG. 6 is a simplified diagram of the photodiode 154 and the control circuitry 152, which includes a storage gate 190. With reference to FIG. 6, each pixel 136 may include a storage gate 190 coupled between a photodiode 154 and a storage node 192. The storage node 192 may store charge from the photodiode 154 to allow a global shutter operation, and may in some examples be electrically and/or optically shielded so as to prevent stray charge and/or light from corrupting the contents of the storage node 192. For example, in a global shutter operation, each of the pixels 136 of image sensor 130 may begin charge integration at the same time. During the integration period, each of the photodiodes 154 may accumulate charge corresponding to light transmitted through the lens 126 that encounters each photodiode 154. After integration, the storage gate 190 may be activated and the charge from the photodiode 154 may be transmitted to the storage node 192. The data from the photodiode 154 may be held at the storage node 192 until the particular pixel 136 is ready to be read out.

When the pixel 136 is to be read out, the transfer gate 158 may be activated to transfer the charge from the storage node 192 to the floating diffusion node 163. Once the data is stored in the floating diffusion 163, the pixel 136 may be operated in substantially the same manner as described above with respect to FIG. 6, i.e., every row may be read out sequentially. During a global shutter operation, all of the pixels 136 may capture light at substantially the same time, which may decrease artifacts in an image due to an object moving. For example, during a rolling shutter operation where each row is sequentially exposed and read out, if an object moves between a first pixel row integration and a last row integration, the image may be blurred. In the image sensor 130 of FIG. 6, the pixels 136 for the entire sensor 130 may be exposed to light and integrate charge at substantially the same time.

In general, many different types of image sensor architectures are contemplated, some of which may include stacked chips, sharing on various levels (e.g., shared floating diffusion nodes, shared storage nodes, shared transfer gates, etc.), global shutter architectures, rolling shutter architectures, still and video image sensors, and so forth as described for example in co-pending application Ser. No. 13/756,459 entitled "Vertically Stacked Image Sensor" filed on Jan. 31, 2013, the entirety of which is hereby incorporated by reference for all purposes.

Figure 7:
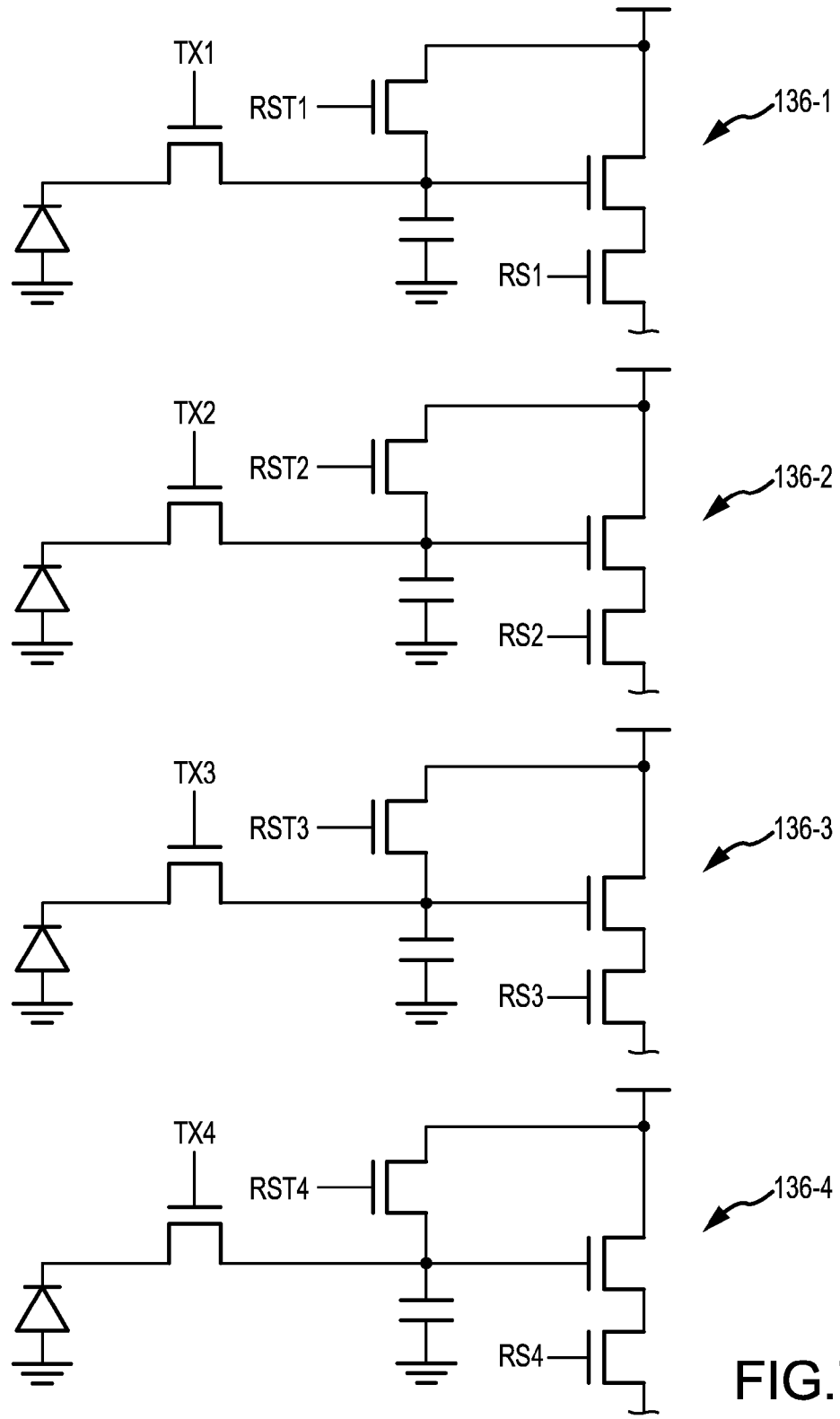
FIG. 7 is a simplified schematic view of four pixel cells having a rolling shutter configuration.
Figure 8:
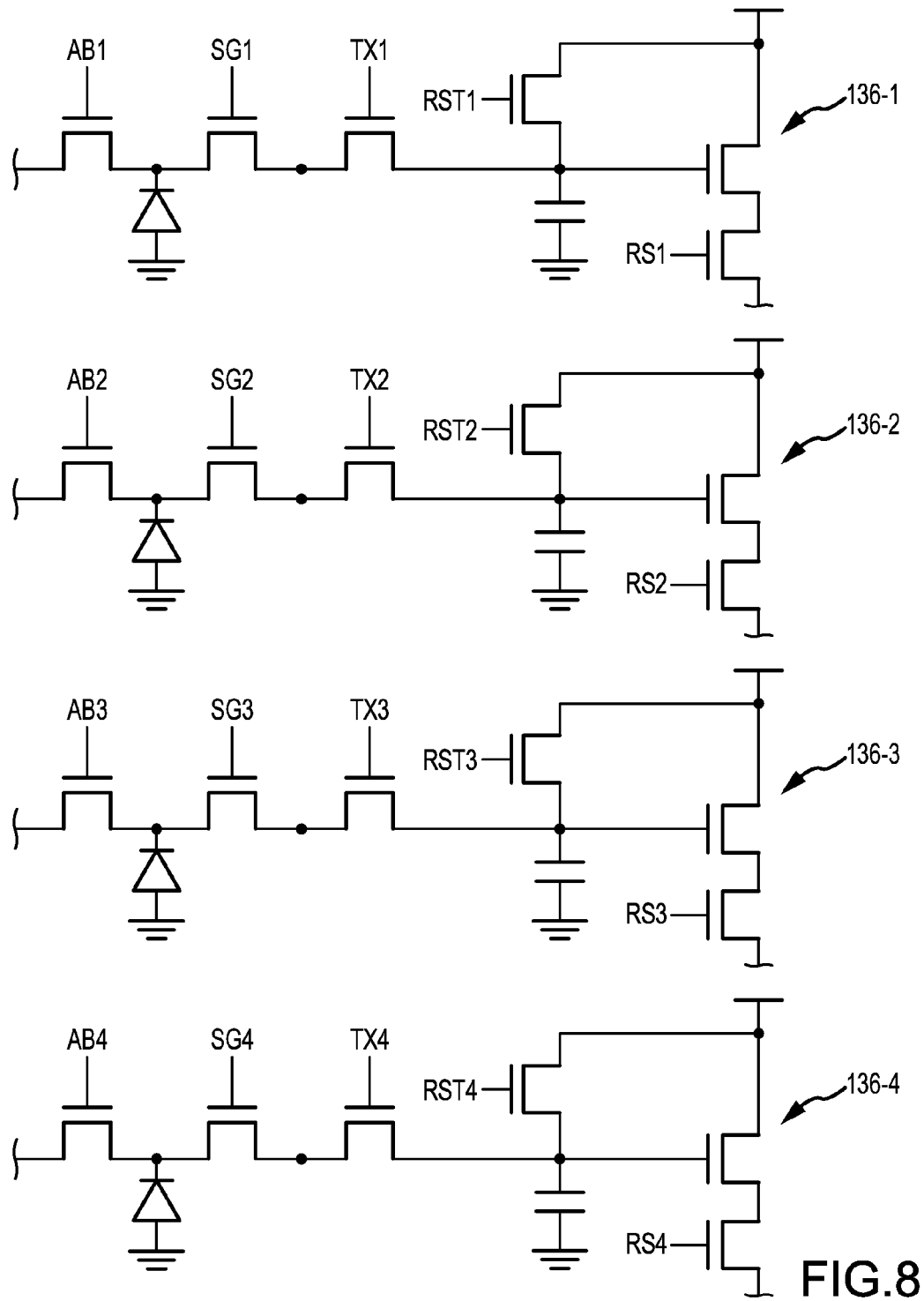
FIG. 8 is a simplified schematic view of four pixel cells having a global shutter configuration.

With reference now to FIGS. 7 and 8, two examples of pixel sub-arrays are illustrated. In FIG. 7, four rolling shutter pixels 136-1, 136-2, 136-3, 136-4 are shown, similar to the pixel 136 illustrated in FIG. 5. In some examples, the four pixels 136-1, 136-2, 136-3, 136-4 in FIG. 7 may be arranged in a 2×2 sub-array and may be one cell of a Bayer CFA; for example, the first pixel 136-1 may be red, the second pixel 136-2 may be green, and the first and second pixels 136-1, 136-2 may share a row select signal. The third pixel 136-3 may be green, the fourth pixel 136-4 may be blue, and the third and fourth pixels 136-3, 136-4 may share a row select signal. Alternatively, one of the second or third pixels 136-2, 136-3 may be a clear pixel instead of a green pixel. In general, the four pixels 136-1, 136-2, 136-3, 136-4 may be associated with one or more different color channels, and any different color filter array may be used.

With reference to FIG. 8, four global shutter pixels 136-1, 136-2, 136-3, 136-4 are shown, each similar to the global shutter pixel 136 illustrated in FIG. 6, and with the optional addition of an anti-blooming gate coupled to the photodiode of each pixel. In some examples, the four pixels 136-1, 136-2, 136-3, 136-4 in FIG. 8 may be arranged in a 2×2 sub-array and may form one cell of a Bayer CFA; for example, the first pixel 136-1 may be red, the second pixel 136-2 may be green, and the first and second pixels 136-1, 136-2 may share a row select signal. The third pixel 136-3 may be green, the fourth pixel 136-4 may be blue, and the third and fourth pixels 136-3, 136-4 may share a row select signal. Alternatively, one of the second or third pixels 136-2, 136-3 may be a clear pixel instead of a green pixel. In general, the four pixels 136-1, 136-2, 136-3, 136-4 may be associated with one or more different color channels, and any different color filter array may be used.

Although various embodiments of image sensors may be described herein with reference to the four pixels shown in FIG. 7 or with reference to the four pixels shown in FIG. 8, it is to be understood that the methods of operating image sensors disclosed herein generally may be employed in either global or rolling shutter architectures and the specific examples given herein are merely for illustration.

Pulsed Exposure

In one embodiment of exposure control, which may be called "pulsed exposure," the overall effective exposure for one or more frames may be divided or partitioned into a plurality of sub-exposures. Subdividing an exposure over a plurality of sub-exposures may extend the absolute time over which an exposure effectively occurs. Such a method may be particularly useful for taking video in bright light situations, where, in order to avoid saturation, the exposure time for each frame needs to be reduced to be only a fraction (½, ⅓, ¼, ⅒, 1/20, 1/50, 1/100, etc.) of the total length of the frame in order to reduce the probability of saturating one or more pixels. Dividing the exposure into multiple sub-exposures may help make the light that is exposed during the video frames more uniform in order to reduce any stroboscopic effects that may otherwise occur if, for example, the pixels of the image sensor are only exposed for the first 5% of each frame. In general, though, pulsed exposure is not limited to use in bright light video situations, and generally may be applied in video or still imaging and in high, medium, or low lighting conditions.

Figure 9:
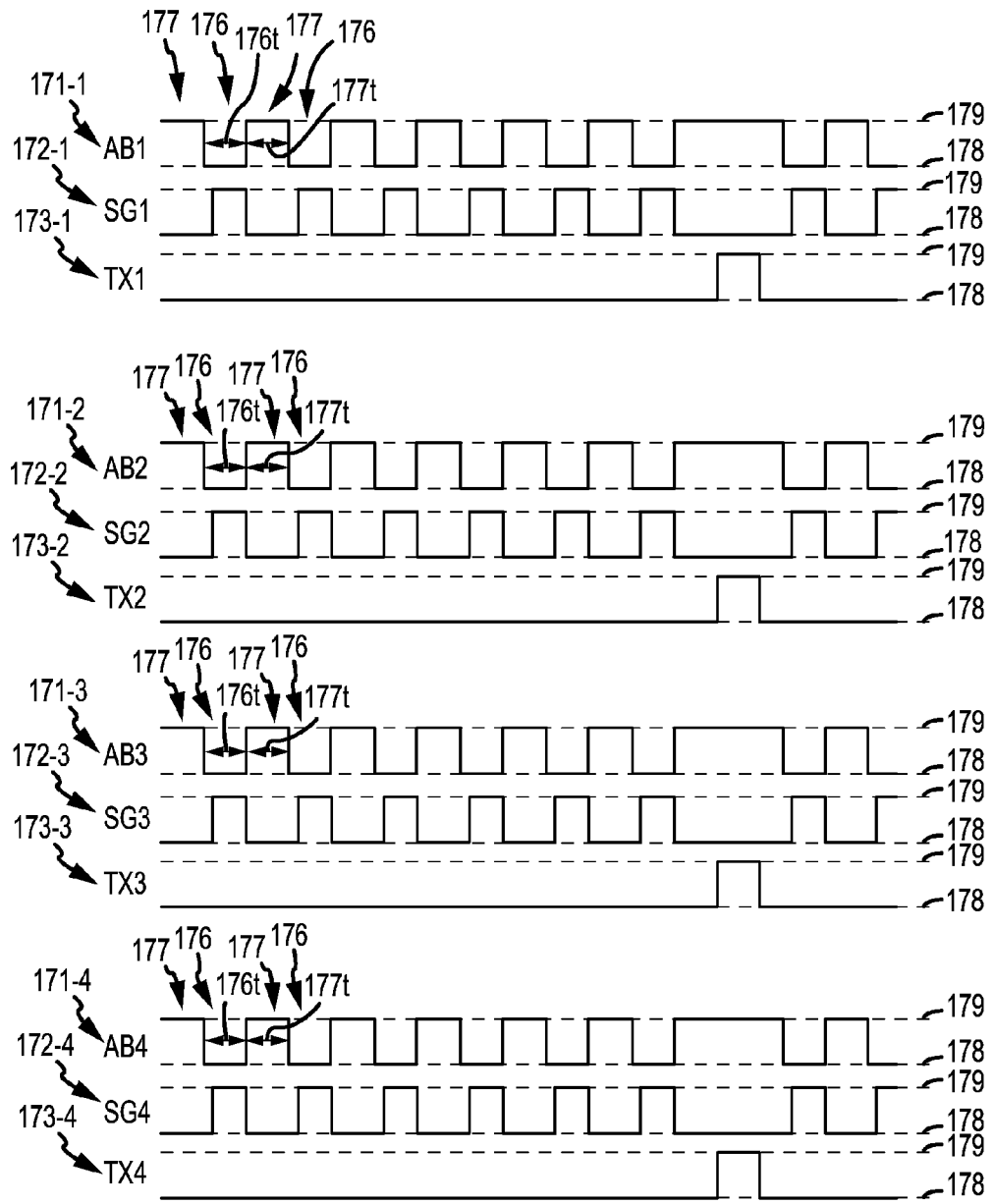
FIG. 9 is a timing diagram for one embodiment of exposure control.

With reference to the pixels 136-1, 136-2, 136-3, 136-4 shown in FIG. 8 and also with reference to the timing diagram in FIG. 9, one or more control signals may be pulsed (e.g., provided alternatingly as logic high 179 and logic low 178, or alternatingly between any two or more different voltages) to control exposure of the photodiodes 154. The pulsed control signal may be an anti-blooming signal 171 provided to anti-blooming gates, a storage gate transfer signal 172 provided to storage gates 190, a transfer signal 173, generally any control signal, or some combination of these. In general, the same control signals may be applied across the different pixels 136-1, 136-2, 136-3, 136-4 in some embodiments; for example, a single storage gate transfer signal may be applied to the storage gates 190 of each of the pixels 136-1, 136-2, 136-3, 136-4. In other words, all of the color channels of the image sensor may, in some embodiments, receive the same exposure control signals. In other examples, different control signals are provided to different ones of the pixels 136-1, 136-2, 136-3, 136-4.

The exposure control signals may selectively cause charge to accumulate during one or more sub-exposures 176 and/or cause charge to be discarded during one or more reset periods 177 (e.g., by coupling the photodiode to a power supply). In one example, and with reference to FIG. 9, one control signal SG1 172-1 selectively causes charge that has accumulated in or accumulating in the photodiode 154 to be transferred to a storage node 192 to be stored. When the control signal SG1 172-1 is asserted as logic high 179, any charge that is generated in the photodiode 154 may be transferred through the storage gate 190 to the storage node 192. Conversely, when the control signal SG1 172-1 is provided as logic low, the storage gate 190 may be closed and no charge may pass from the photodiode 154 to the storage node 192. Still referring to the timing diagram of FIG. 9, another control signal AB1 171-1 causes a photodiode to be selectively electrically coupled to an anti-blooming node (which may be a power supply), so that when the control signal AB1 171-1 is asserted as logic high 179, any charge that is generated in the photodiode does not accumulate but is discarded (which may be referred to as a reset period 177). When the control signal AB1 171-1 is provided as logic low 178, the photodiode is decoupled from the anti-blooming node and charge is allowed to accumulate in the photodiode and/or is otherwise captured (which may be referred to as a sub-exposure 176). In other words, the control signal AB1 171-1 may control the effective exposure or integration time of the pixel 136-1.

In general, a frame may include any number of sub-exposures 176 and any number of reset periods 177. For example, one frame (which may be representative of, for example, one still image standing alone or one still image in a series of images for a video) may be divided into 2, 3, 4, 10, 50, 100, 1000, 10,000 sub-exposures 176 or any other suitable number, and the charge accumulated during the two or more sub-exposures 176 may all be collected in the storage node 192 prior to being transferred to the floating diffusion node 163. In some examples, all of the two or more sub-exposures 176 may have substantially the same duration 176*t* (as one non-limiting example, each has a duration of 1 ms), or may have different durations (e.g., some sub-exposures are longer than others). Also, in some examples, one or more of the sub-exposures 176 may have substantially the same duration as one or more reset periods 177, or the duration 176*t* of one or more of the sub-exposures 176 may be substantially more or less than the duration 177*t* one or more of the reset periods 177. For one example, one or all of the reset periods 177 may be 0.1, 0.5, 1.5, 2, 5, 10, 100, 1000, 10,000 times that of one or more of the sub-exposures 176.

After charge has accumulated and been transferred to the storage node 192 after two or more sub-exposures 176, a transfer signal TX1 173-1 may be provided to the transfer gate 158 coupled between the storage node 192 and the floating diffusion node 163. The transfer signal TX1 173-1 may be asserted as logic high 179 to effectuate the transfer in some embodiments and with reference to FIG. 8. Because all of the charge accumulated in each of the plurality of sub-exposures 176 is collected in the storage node 192, the pixel sums charge in the analog domain, rather than digitally sampling the charge collected during each sub-exposure 176 and summing the digital data. Such analog domain charge summing may require less power than would be needed to digitally sample sub-exposure charge and then sum the digital samples, and analog domain charge summing may be more accurate because it may reduce the amount of noise introduced into the summing as compared with the digital sampling and summing.

With reference to FIGS. 8 and 9, and as previously mentioned, the control signals AB1, SG1, TX1 provided to one pixel 136-1 may be sub substantially identical to the control signals AB2, SG2, TX2 provided to the second pixel 136-2, the control signals AB3, SG3, TX3 provided to the third pixel 136-3, and the control signals AB4, SG4, TX4 provided to the fourth pixel 136-4. The control signals may be provided to the various pixels 136-1, 136-2, 136-3, 136-4 in generally any manner. Although FIG. 9 shows the transfer signals TX1, TX2, TX3, TX4 as being provided to each of the pixels 136-1, 136-2, 136-3, 136-4 at substantially the same time, in another embodiment, the transfer signals may be staggered in order to allow for sharing of a floating diffusion node and/or to allow for a row-by-row rolling readout.

Per Color Channel Exposure

In another embodiment of exposure control, which may be called "per color channel exposure," the effective exposure of photodiodes for one or more frames may vary among different color pixels. As described above, different color pixels may have different sensitivities to similarly bright light, and thus it may be advantageous to provide different effective exposure times (also known as integration times) among the different colored pixels to help overcome the fundamental differences in sensitivity between the different color channel pixels. Such method may be particularly useful for taking still image shots of static scenes because it does not necessarily require pulsed exposure as explained above and because the objects to be imaged may not be in motion. In general, though, per color channel exposure is not limited to use for still images of static scenes, and generally may be applied in video or still imaging, in dynamic or static scenes, in high, medium, or low lighting conditions and so forth.

Figure 10:
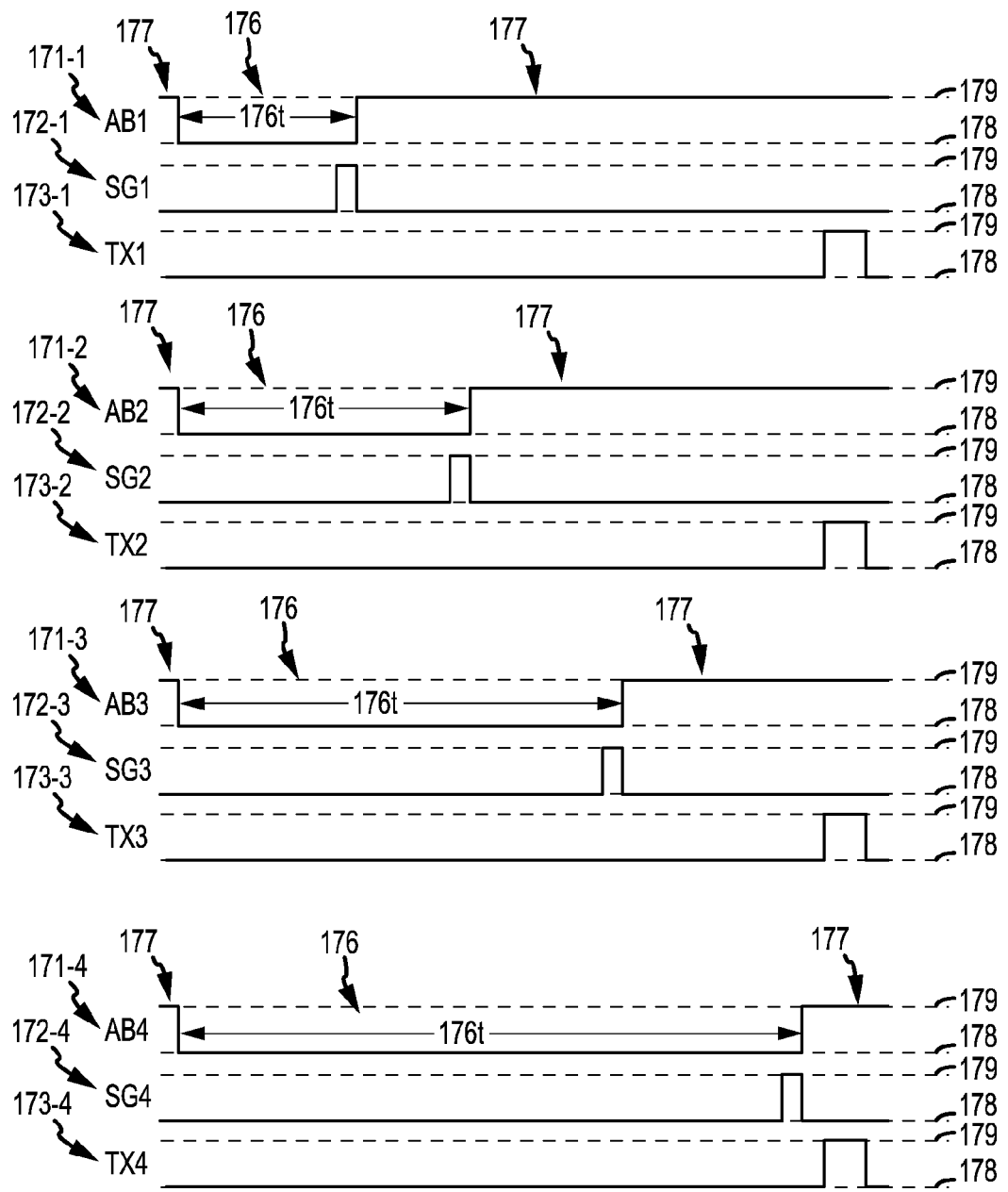
FIG. 10 is a timing diagram for another embodiment of exposure control.

With reference to the pixels 136-1, 136-2, 136-3, 136-4 shown in FIG. 8 and also with reference to the timing diagram in FIG. 10, one or more exposure control signals may be provided to each of the pixels 136-1, 136-2, 136-3, 136-4 to control the effective exposure of the corresponding photodiodes 154. The exposure control signal may be an anti-blooming signal 171 provided to an anti-blooming gate, a storage gate transfer signal 172 provided to a storage gate 190, a transfer signal 173, generally any control signal, or some combination of these. In general, the same control signals may not be provided across the different pixels 136-1, 136-2, 136-3, 136-4 in some embodiments. For example, a first storage gate transfer signal SG1 172-1 and/or a first anti-blooming signal AB1 171-1 may be provided to the storage gate 190 and anti-blooming gate of the first pixel 136-1, while a second storage gate transfer signal SG2 172-2 and/or a second anti-blooming signal AB2 171-2 may be provided to the storage gate 190 and anti-blooming gate of the second pixel 136-2, and so forth.

The exposure control signals may selectively cause charge to accumulate and/or cause charge to be discarded (e.g., by electrically coupling the photodiode to a power supply). In one example, and with reference to FIG. 10, the first pixel 136-1 may be associated with a first color channel, for example clear or green. One control signal AB1 171-1 may cause the photodiode to selectively be coupled to an anti-blooming node (which may be a power supply), so that when the control signal AB1 171-1 is asserted as logic high 179, any charge that is generated in the photodiode does not accumulate but is discarded (which may be referred to as a reset period 177). When the control signal AB1 171-1 is provided as logic low 178, the photodiode is decoupled from the anti-blooming node and charge is allowed to accumulate in the photodiode and/or is otherwise captured (which may be referred to as the effective exposure 176 of the photodiode). Still referring to the timing diagram of FIG. 10, another control signal SG1 172-1 selectively causes charge that has accumulated in or is accumulating in the photodiode 154 to be transferred to a storage node 192 to be stored. When the control signal SG1 172-1 is asserted as logic high 179, any charge that is generated in the photodiode 154 may be transferred through the storage gate 190 to the storage node 192, whereas when the control signal SG1 172-1 is provided as logic low 178, the storage gate 190 may be closed and no charge may pass from the photodiode 154 to the storage node 192.

With reference still to FIGS. 8 and 10, similar exposure control signals AB2 171-2 and SG2 172-2 are provided to the second pixel 136-2, which may be associated with a color channel different from the color channel with which the first pixel 136-1 is associated. The second pixel 136-2 may be associated with, for example, red or blue, or possibly green if the first pixel 136-1 is associated with a clear color channel. The exposure control signal AB2 171-2 provided to the second pixel 136-2 is, however, different from the exposure control signal AB1 171-1 provided to the first pixel 136-1 in that the exposure control signal AB2 171-2 provided to the second pixel 136-2 allows for a longer effective exposure 176 of the second pixel 136-2 than the first pixel 136-1. In other words, the exposure control signal AB1 171-1 causes charge to accumulate in the photodiode 154 of the first pixel 136-1 for a shorter period of time 176$t$ than the period of time 176$t$ during which exposure control signal AB2 171-2 allows for charge to accumulate in the photodiode 154 of the second pixel 136-2. The periods of time during which the first and second pixels 136-1, 136-2 accumulate charge may be at least partially contemporaneous with one another in some examples, but may not be in other examples.

Third and fourth groups of similar exposure control signals are provided to the third and fourth pixels 136-3, 136-4 in FIG. 8, with the effective exposure 176 of the third pixel 136-3 being longer than the effective exposure 176 of the second pixel 136-2 and the effective exposure 176 of the fourth pixel 136-4 being longer than the effective exposure 176 of the third pixel 136-3. The effective exposure 176 of the fourth pixel 136-4 may be as long as practically possible based on a required frame rate or user selected exposure time in some embodiments. As just one example, the effective exposure 176 of the fourth pixel 136-4 may be 15 milliseconds and the fourth pixel 136-4 may be associated with a red color channel. The effective exposure 176 of the third pixel 136-3 may be 11 milliseconds, and the third pixel may be associated with a blue color channel. The effective exposure 176 of the second pixel 136-2 may be 8 milliseconds, and the second pixel may be associated with a green color channel. The effective exposure 176 of the first pixel may be 3 milliseconds, and the first pixel may be associated with a clear color channel. In general, the durations of effective exposure 176 for the different pixels 136-1, 136-2, 136-3, 136-4 may be determined based on the relative sensitivities of the different color channels associated with the different pixels 136-1, 136-2, 136-3, 136-4. Determining the durations of the effective exposures 176 may include in some examples, setting the least sensitive color channel pixels to have as long of effective exposure time as allowed, and then reducing the other color channel pixels to have shorter effective exposure times based on the sensitivities of those other color channels relative to the least sensitive color channel. Also, if two of the pixels are associated with the same color channel, they may have similar effective exposure times.

Some of the exposure control signals AB1 171-1, AB2 171-2, AB3 171-3, AB4 171-4 may cause charge to be drained or discarded from the respective photodiodes 154 of the pixels 136-1, 136-2, 136-3, 136-4 after each respective effective exposure time has ended. For example, with reference to the first pixel 136-1 in FIG. 10, following the effective exposure 176 of the photodiode 154, the exposure control signal SG1 172-1 may transition to logic low 178, and the control signal AB1 may transition to logic high 179. Providing the control signal AB1 171-1 as logic high may end the effective exposure 176 and induce drainage of any further charge generated in the photodiode 154 of the first pixel 136-1, with the drainage beginning after the end of the effective exposure period of the first pixel 136-1 but before the end of effective exposure of the second pixel 136-2. In other words, the photodiode 154 of the second pixel 136-2 may continue to be effectively exposed and accumulate charge while generated charge is being drained away from the photodiode 154 of the first pixel 136-1.

After charge has accumulated and been transferred to the storage node 192 in each of the pixels 136-1, 136-2, 136-3, 136-4, a transfer signal 173 may be provided to the transfer gate 158 coupled between the storage node 192 and the floating diffusion node 163 for each pixel, as illustrated in FIG. 10. The transfer signal 173 may be asserted as logic high 179 to effectuate the transfer. In the global shutter implementation illustrated in FIGS. 8 and 10, even though the effective exposures 176 of the different pixels 136-1, 136-2, 136-3, 136-4 may span different times and have different effective exposure durations (though each pixel 136-1, 136-2, 136-3, 136-4 may be effectively exposed substantially contemporaneously during at least the effective exposure 176 of the first pixel 136-1 as illustrated in FIG. 10), the global transfer of accumulated charge from each respective storage node to each respective floating diffusion node may happen substantially contemporaneously (e.g., may be a global transfer). In another embodiment, however, the transfer signals TX1 173-1, TX2 173-2, TX3 173-3, TX4 173-4 provided to the pixels 136-1, 136-2, 136-3, 136-4 may be staggered in order to allow for sharing of a floating diffusion node and/or to allow for a row-by-row rolling readout.

Figure 11:
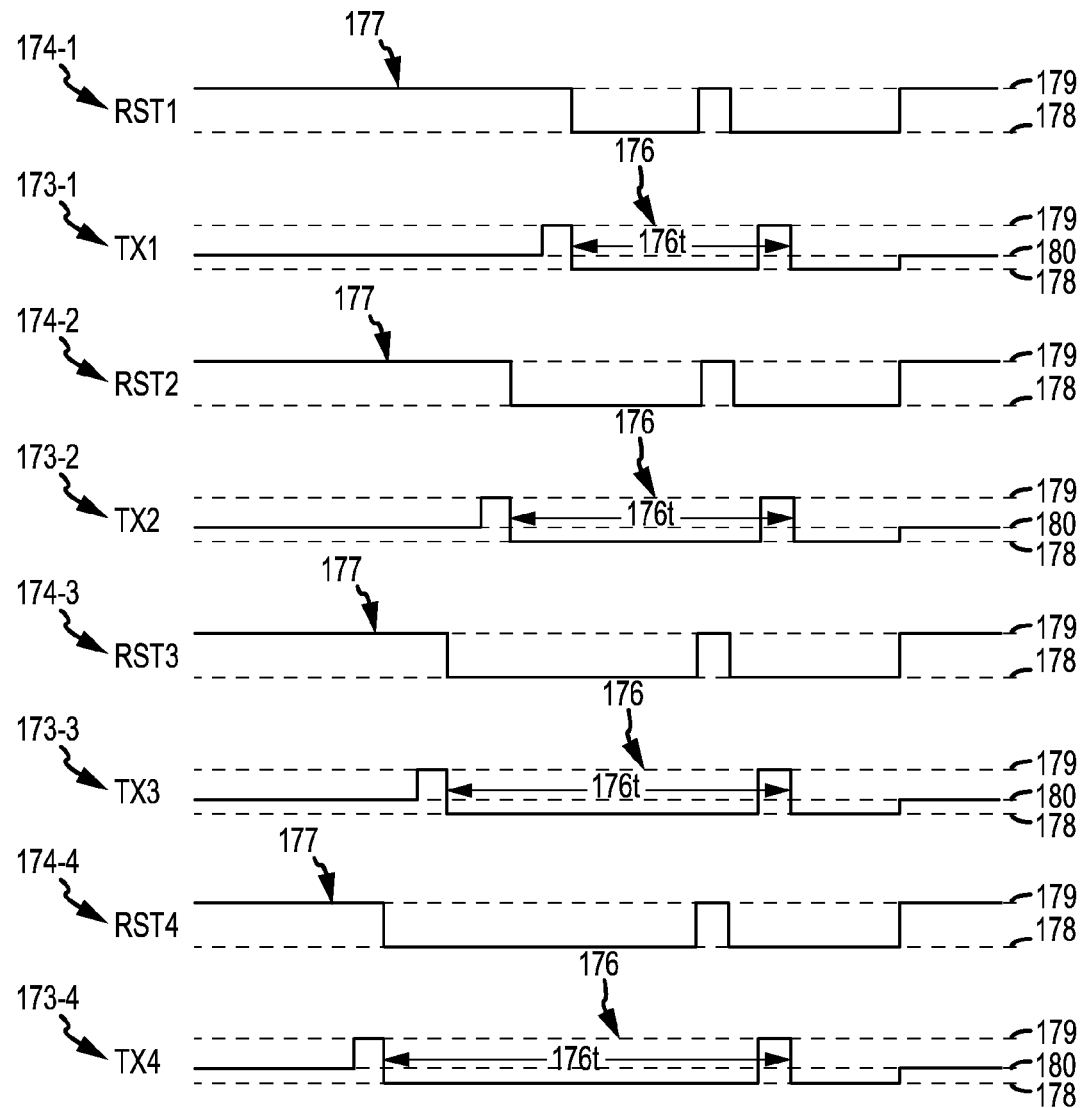
FIG. 11 is a timing diagram for still another embodiment of exposure control.

As mentioned above, any of the exposure control methods described herein may be applicable to any type of image sensor architecture, including both rolling and global shutters. With reference to FIGS. 5, 7, and 11, for example, if per color channel exposure is used in an image sensor with rolling shutter, a signal 173 provided to the transfer gate 158 may function as a combination of one or more of an anti-blooming signal, a storage signal, a transfer signal, and so forth, with the signal being provided at a plurality of different voltage levels. For example, the signal 173 may function as an integration signal when it is strongly negative 178 (e.g., −1.2 volts) so that the photodiode 154 is isolated from the floating diffusion node 163, may function as a transfer signal when it is strongly positive 179 (e.g., +2.8 volts) so that charge accumulated in the photodiode 154 is transferred to the floating diffusion node 163, and may function as an anti-blooming signal when it is slightly positive 180 (e.g., +0.2 volts) because it is slightly leaky.

Referring to the timing diagram illustrated in FIG. 11, in some embodiments, a reset signal RST1 174-1 may be provided to the reset gate 156 of the first pixel 136-1 (which may be a clear or other sensitive pixel color) as logic high 179, while the transfer signal TX1 173-1 is provided to the transfer gate 158 at a slightly positive voltage 180 so as to leak accumulated charge away (i.e., to prevent blooming). The transfer signal TX1 173-1 may be pulsed to a logic high 179, and then be provided as logic low 178 at a strongly negative voltage. At approximately the same time as the transfer signal TX1 173-1 transitions to logic low 178, the reset signal RST1 may also transition to logic low 178. This may then begin the exposure or integration of the first pixel 136-1. Shortly before the end of the exposure of the first pixel 136-1, the reset signal RST1 may briefly be pulsed to logic high 179 and then back to logic low 178 in order to reset the floating diffusion node 163, and optionally to read out a voltage in the reset floating diffusion node. Then, the transfer signal TX1 173-1 is pulsed to logic high 179 then back to logic low 178 in order to transfer the charge to the floating diffusion node 163 and read out the same. Then, the transfer signal TX1 173-1 is set to the slightly positive voltage 180 in order to again enter an anti-blooming mode. Similar control signals may be provided to the other pixels 136-2, 136-3, 134, except that those pixels may remain in the anti-blooming mode, with the slightly positive voltage 180 being provided to the transfer gate 158, for different amounts of times. For example, the second pixel 136-2 may remain in anti-blooming mode for slightly less time than the first pixel 136-1, with the third and fourth pixels 136-3, 136-4 remaining in anti-blooming mode for even less time. If all of the pixels 136-1, 136-2, 136-3, 136-4 are read out at substantially the same time, as illustrated in FIG. 11, the effective exposures 176t of the pixels 136-1, 136-2, 136-3, 136-4 will be different because of the different amounts of time during which the slightly leaky, anti-blooming voltage 180 was provided to the transfer gate 158. In this manner, less sensitive pixels (e.g., 136-4) may be exposed for a longer period of time 176t than more sensitive pixels (e.g., 136-1) so that the more sensitive pixels do not over fill with charge. Furthermore, because the anti-blooming voltage 180 is provided to the pixels when they are not being exposed, anti-blooming may be reduced or eliminated.

With reference now to FIGS. 10 and 11, it will be understood that references to signals being 'before' or 'after' another signal are relative, and some embodiments may include signals provided in a switched context. For example, although FIG. 10 illustrates beginning the exposure periods 176 for each of the pixels 136-1, 136-2, 136-3, 136-4 at substantially the same time and ending the exposure periods of the pixels 136-1, 136-2, 136-3, 136-4 at staggered times (e.g., the first pixel 136-1 ends its exposure before the second pixel 136-2 ends its exposure, and so forth), in another example, the pixels 136-1, 136-2, 136-3, 136-4 start exposure periods 176 at staggered times, and end exposure periods 176 at substantially the same time, as illustrated in the rolling shutter example in FIG. 11. In general, the exposure periods 176 for the pixels 136-1, 136-2, 136-3, 136-4 may begin or end 'before' or 'after' one another in a large variety of combinations to achieve the operation and results described.

Pulsed Per Color Channel Exposure

One other embodiment of exposure control, called "pulsed per color channel exposure," may, to a certain extent combine elements of both "pulsed exposure" control and "per color channel exposure" control. More specifically, in pulsed per color channel exposure control, the overall effective exposure for one or more frames may be divided or partitioned into a plurality of sub-exposures for pixels in one or more color channels, with the durations of sub-exposures between the different color channels being different due to the different sensitivities of each color channel. For one color channel (e.g., the least sensitive color channel such as red), the exposure may not be divided or partitioned at all in some examples. This may allow for the least sensitive color channel to accumulate charge over the maximum amount of time possible (based on, e.g., frame rate, user selected exposure duration, etc.), while partitioning the exposure of the other color channels into a plurality of sub-exposures. The sub-exposures may span the same absolute time as the exposure of the least sensitive channel but may effectively expose the respective photodiodes 154 for different durations or amounts of time depending on the color channel sensitivity. Such method may be particularly useful for taking video or still shots of dynamic scenes (e.g., where an object to be imaged is moving). As with pulsed exposure, dividing the exposure into multiple sub-exposures may help make the light that is exposed during the video frames more uniform in order to reduce any stroboscopic effects that may otherwise occur if, for example, the pixels of the image sensor are only exposed for some portion of each frame, while similar to per color channel exposure, the exposure of different pixel color channels is compensated based on the sensitivities of the respective photodiodes 154 to different wavelengths of light. In general, though, pulsed per color channel exposure is not limited to use in any particular situation, and generally may be applied in any video or still imaging application.

Figure 12:
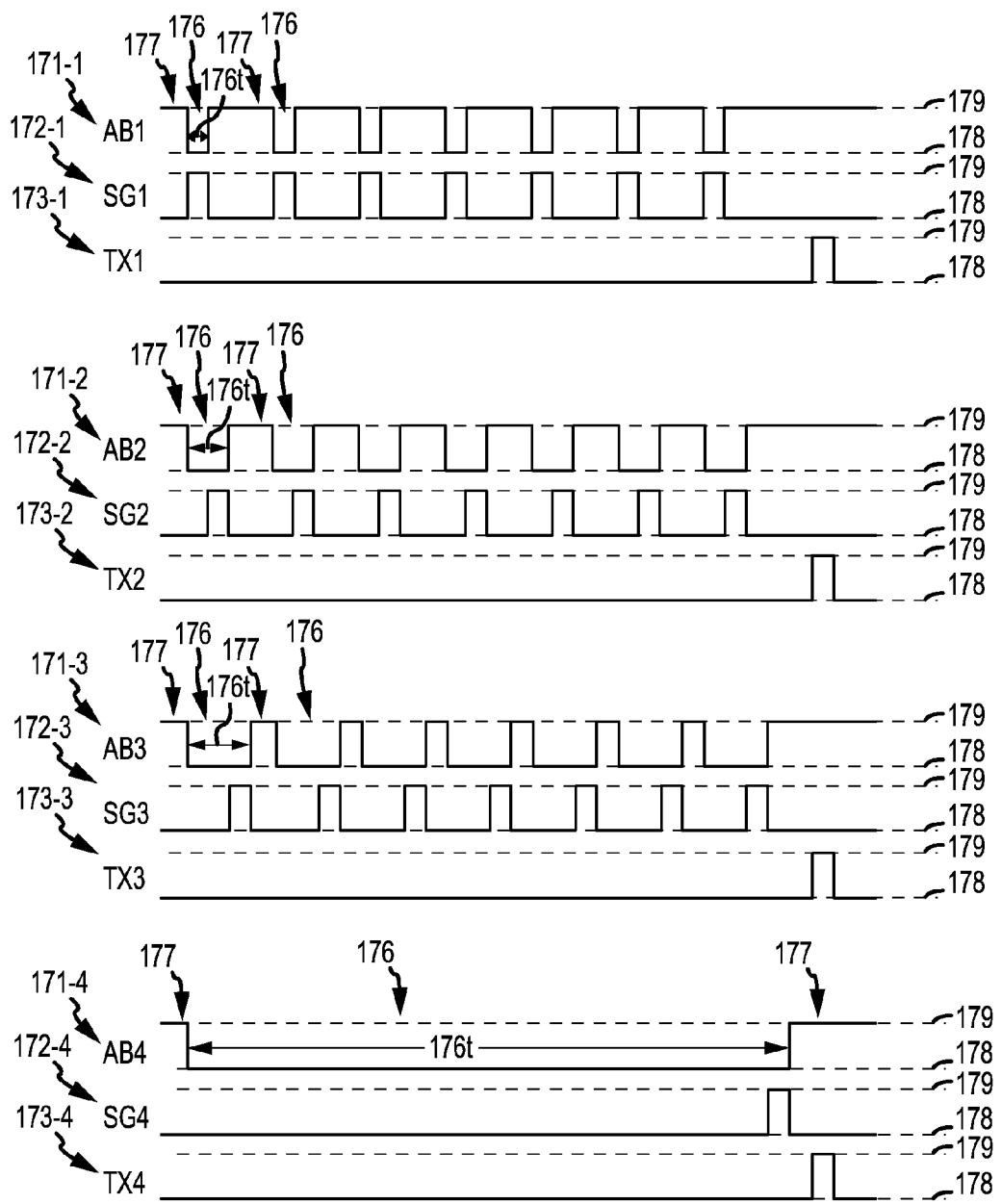
FIG. 12 is a timing diagram for still another embodiment of exposure control.

With reference to the pixels 136-1, 136-2, 136-3, 136-4 shown in FIG. 8 and also with reference to the timing diagram in FIG. 12, one or more control signals may be pulsed (e.g., provided alternatingly as logic high 179 and logic low 178, or alternatingly between any two or more different voltages) to control exposure of the photodiodes 154, with different control signals being provided to pixels 136-1, 136-2, 136-3, 136-4 in different color channels so that the effective exposure of photodiodes 154 in different color channels have different durations 176*t*. As above, the control signal may be an anti-blooming signal 171 provided to an anti-blooming gate, a storage gate transfer signal 172 provided to a storage gate 190, a transfer signal 173 provided to a storage gate, generally any control signal, or some combination of these. Also as above, the control signal(s) may selectively cause charge to accumulate during one or more sub-exposures 176 (or sole exposure 176 for the least sensitive color channel) and/or cause charge to be discarded during one or more reset periods 177.

Referring still to FIGS. 8 and 12, the first pixel 136-1 may be the most sensitive pixel, with the second pixel 136-2 being less sensitive than the first pixel 136-1, the third pixel 136-3 being less sensitive than the second pixel 136-2, and the fourth pixel being associated with the least sensitive color channel. Referring to the control signals AB1 171-1 and SG1 172-1 illustrated in the timing diagram in FIG. 11, the photodiode 154 of the first pixel 136-1 may selectively accumulate charge during a first plurality of sub-exposures 176, with the sub-exposures 176 generally being the period of time when the AB1 signal 171-1 is provided as logic low 178. After or during each of the first plurality of sub-exposures 176, the charge accumulated in the photodiode 154 may be transferred to the respective storage node 192 through storage gate 190 responsive to a logic high 179 pulse of the control signal SG1 172-1. The control signals AB2, SG2, AB3, SG3 provided to the second and third pixels 136-2, 136-3 may be similar to those provided to the first pixel 136-1, except that they may provide for sub-exposures 176 of respectively longer duration. Also, control signals AB4, SG4 may be provided to the fourth pixel 136-4 so that the fourth pixel is only effectively exposed 176 once.

As one example, the fourth pixel 136-4 may be associated with the red color channel and may be exposed for 28 total milliseconds in a single exposure 176. The third pixel 136-3 may be associated with the blue color channel and may be exposed for a total of 21 milliseconds during seven sub-exposures 176 of 3 milliseconds each. The second pixel 136-2 may be associated with the green color channel and may be exposed for a total of 14 milliseconds during seven sub-exposures 176 of 2 milliseconds each. The first pixel 136-1 may be associated with the clear color channel and may be exposed for a total of 7 milliseconds during seven sub-exposures 176 of 1 millisecond each. Of course, these times are merely given by way of example and there may be different numbers (e.g., 2, 3, 4, 10, 50, 100, 1000, 10,000) of sub-exposures 176 between the different color channels, the sub-exposure 176 durations need not be integer multiples of one another between the different color channels, the durations of sub-exposures 176 within each pixel or color channel need not be the same, and so forth. Also, in some examples, such as image sensors with a traditional Bayer pattern, two or more of the pixels 136-1, 136-2, 136-3, 136-4 may have identical exposure or sub-exposure durations, and each pixel or each color channel need not necessarily be different from the others.

As with pulsed exposure, after charge has accumulated and been transferred to the storage node 192 in each respective pixel 136-1, 136-2, 136-3, 136-4, a transfer signal 173 may be provided to the transfer gate 158 coupled between the storage node 192 and the floating diffusion node 163 for each respective pixel 136-1, 136-2, 136-3, 136-4. The transfer signal 173 may be asserted as logic high 179 to effectuate the transfer, and may be provided to all of the pixels 136-1, 136-2, 136-3, 136-4 at substantially the same time in one embodiment, or may be staggered as described above with reference to FIGS. 9 and 10. Because all of the charge accumulated in each of the plurality of sub-exposures is collected in the storage node 192, the pixel sums charge in the analog domain, as described above.

CONCLUSION

The foregoing description has broad application. For example, while examples disclosed herein may focus on particular architectures of image sensors (e.g., photodiode, global shutter, rolling shutter, CMOS sensors, etc.), it should be appreciated that the concepts disclosed herein may equally apply to substantially any other type of image sensor with or without appropriate modifications as would be appreciated by one skilled in the art of image sensors. Moreover, although certain examples have been described with reference to particular color channels or particular exposure times, it will be understood that other color channels and other exposure times are also within the scope of this disclosure and the appended claims.

Furthermore, the various exposure control methods described herein may find application in many different implementations. For example, one or more of the exposure control methods may be implemented in response to a manufacturer setting to, for example, use per color channel exposure control with certain relative effective exposure durations for the different color channels, or to use the pulsed exposure control when a bright light scene is to be imaged. In other examples, the control methods described herein may be implemented in response to a user changing a configurable setting for the image sensor. The user configurable settings may provide various special effects in-sensor in certain embodiments. In still other examples, the exposure control methods may be used and/or modified dynamically based on a preview frame of an image to be taken or on recent images captured by the image sensor. For example, when taking a still shot, the image sensor may be operated in a preview mode to determine the appropriate effective exposure control method to use and the specific parameters to be used (e.g., the length of sub-exposures, the total effective duration for a particular color channel, etc.). As another example, when taking a video with the image sensor, the type of exposure control to be used in a future frame and the parameters of that control may be determined based on analyzing histograms or other characteristics of a current or recent frame. As still another example, any one or more of the effective exposure control methods described herein may be used for interleaved imaging—for example, in interleaved high dynamic range imaging (i-HRD), a single image sensor may substantially simultaneously capture two or more images (for two images, the odd rows may capture an image with a first effective exposure time while the even rows capture an image of the same scene with a second, different effective exposure time).

Also, the various control signals described herein may be provided to the pixels and control circuitry of the pixels in any appropriate manner, including by using multiplexers or other electronic circuits within or outside of the image sensor.

Accordingly, the discussion of any embodiment is meant only to be exemplary and is not intended to suggest that the scope of the disclosure, including the claims, is limited to these examples.

What is claimed is:

1. A method of operating an image sensor, comprising:
    selectively storing, responsive to a first control signal, charge accumulated in a photodiode during a first sub-exposure in a storage node;
    selectively discarding, responsive a second control signal, charge accumulated in the photodiode during a first reset period, wherein a first duration of the first sub-exposure is less than a second duration of the first reset period;
    selectively storing, responsive to the first control signal, charge accumulated in the photodiode during a second sub-exposure in the storage node; and
    transferring, responsive to a third control signal, charge stored in the storage node from the first and second sub-exposures to a floating diffusion node.

2. The method of claim 1, wherein the first control signal comprises a transfer signal provided to a storage gate coupled between the photodiode and the storage node.

3. The method of claim 2, wherein the second control signal comprises an anti-blooming signal provided to an anti-blooming gate coupled to the photodiode.

4. The method of claim 2, wherein the second control signal is the transfer signal provided to the storage gate.

5. The method of claim 2, wherein the third control signal comprises a transfer signal provided to a transfer gate coupled between the storage node and the floating diffusion node.

6. The method of claim 1, further comprising selectively storing, responsive to the first control signal, charge accumulated in the photodiode during third and fourth sub-exposures in the storage node, the first, second, third, and fourth sub-exposures corresponding to a single frame of the image sensor.

7. The method of claim 1, further comprising resetting the photodiode during the first reset period responsive to a reset signal.

8. The method of claim 1, wherein a respective duration of respective first and second sub-exposures is substantially the same.

9. The method of claim 1, wherein a third duration of the second sub-exposure is greater than or substantially the same as the second duration of the first reset period.

10. The method of claim 1, wherein the second duration is at least 5 times that of the first duration.

11. An image sensor pixel, comprising:
    a photodiode;
    a storage node;
    a storage gate coupled between the photodiode and storage node, the storage gate selectively receiving an exposure control signal and being responsive thereto;
    a floating diffusion node;
    an anti-blooming gate coupled to the photodiode, the anti-blooming gate selectively receiving an anti-blooming control signal and being responsive thereto;
    a transfer gate coupled between the storage node and floating diffusion node, the transfer gate selectively receiving a transfer control signal and being responsive thereto; and
    control circuitry configured to provide the anti-blooming control signal to the anti-blooming gate such that charge accumulated in the photodiode is discarded, the control circuitry configured to provide the exposure control signal to the storage gate such that the charge accumulated in the photodiode during a plurality of sub-exposures is transferred to the storage node after or during each sub-exposure, the control circuitry further configured to provide the transfer control signal to the transfer gate following the a plurality of sub-exposures such that charge stored in the storage node is transferred to the floating diffusion node, wherein a duration of at least one sub-exposure is less than a duration of at least one charge discard period.

12. The image sensor pixel of claim 11, wherein the storage node is electrically and optically shielded.

13. The image sensor pixel of claim 11, wherein the image sensor pixel is associated with a first color channel, further wherein another image sensor pixel associated with a different color channel receives the same anti-blooming, exposure, and transfer control signals as the image sensor pixel.

14. A method of operating an image sensor, comprising:
    selectively accumulating charge in a first photodiode associated with a first color channel during a first period of time responsive to a first exposure control signal; and
    selectively accumulating charge in a second photodiode associated with a second color channel during a second period of time responsive to a second exposure control signal;
    wherein charge is drained away from the first photodiode before the first period of time begins but after the second period of time has started, and
    wherein the first color channel is different than the second color channel and the first period of time is shorter than the second period of time, the first and second periods of time being at least partially contemporaneous with each other.

15. The method of claim 14, wherein the charge is drained away responsive to providing an anti-blooming signal to a transfer gate coupled to the first photodiode.

16. The method of claim 14, wherein the second photodiode continues to accumulate charge while first photodiode begins to accumulate charge.

17. The method of claim 14, further comprising transferring the accumulated charge from the first photodiode to a first floating diffusion or storage node at substantially the same time as transferring charge from the second diode to a second floating diffusion or storage node.

18. The method of claim 14, further comprising resetting the first and second photodiodes responsive to a reset signal before accumulating charge during the first and second periods of time.

19. An image sensor, comprising:
    a first pixel associated with a first color channel and configured to accumulate charge for a first period of time responsive to a first control signal;
    a second pixel associated with a second color channel and configured to accumulate charge for a second period of time responsive to a second control signal; and
    a transfer gate configured to drain charge away from the first pixel responsive to an anti-blooming signal, wherein the anti-blooming signal is applied to the transfer gate to drain charge away from the first pixel before the first period of time begins and after the second period of time has started, and wherein the first color channel is different than the second color channel and the first period of time is shorter than the second period of time.

20. The image sensor of claim 19, wherein the first color channel is clear and the second color channel is green.

21. The image sensor of claim 19, wherein the first color channel is green and the second color channel is red.

22. The image sensor of claim 19, wherein the transfer gate comprises an anti-blooming gate configured to drain charge away from the first pixel responsive to the anti-blooming signal.

23. The image sensor of claim 19, wherein the anti-blooming gate comprises a transfer gate coupled between the photodiode and a floating diffusion or a storage node.

24. The image sensor of claim 19, wherein the first pixel is a global shutter pixel and comprises a storage node.

25. The image sensor of claim 19, wherein the first pixel is a rolling shutter pixel.

26. The image sensor of claim 19, further comprising control circuitry for providing the first and second control signals, the control circuitry comprising one or more multiplexers configured to selectively provide one of a plurality of voltage levels as the first or second control signals.

27. A method of operating an image sensor, comprising:
selectively accumulating charge in a first photodiode associated with a first color channel during a first plurality of sub-exposures;
selectively transferring, responsive to a first control signal, charge accumulated in the first photodiode during each of the first plurality of sub-exposures to a first node;
selectively accumulating charge in a second photodiode associated with a second color channel during a second plurality of sub-exposures;
selectively transferring, responsive to a second control signal, charge accumulated in the first photodiode during each of the second plurality of sub-exposures to a second node; and
selectively discarding, responsive a third control signal, charge accumulated in the first photodiode during a plurality of reset periods, a reset period occurring after each sub-exposure in the first plurality of sub-exposures,
wherein a duration of at least one sub-exposure in the first plurality of sub-exposures is less than a duration of at least one reset period in the plurality of reset periods, and wherein the first color channel is different than the second color channel and at least one of the first plurality of sub-exposures is shorter than at least one of the second plurality of sub-exposures, the first and second plurality of exposures being at least partially contemporaneous.

28. The method of claim 27, wherein the image sensor is operated in an interleaved high dynamic range mode, and the first color channel is associated with a first set of pixels forming a first image, and the second color channel is associated with a second set of pixels forming a second image, the first and second images being acquired by the image sensor at substantially overlapping times.

29. The method of claim 27, wherein the image sensor has a rolling shutter architecture.

30. The method of claim 27, wherein the image sensor has a global shutter architecture.

31. The method of claim 27, wherein the image sensor is operated in a video mode.

32. The method of claim 27, wherein the first and second nodes respectively comprise first and second storage nodes.

33. A method of operating an image sensor, comprising:
partitioning a first exposure of a first pixel associated with a first color channel into a first plurality of sub-exposures, each of the first plurality of sub-exposures having a respective duration; and
partitioning a second exposure of a second pixel associated with a second color channel into a second plurality of sub-exposures, each of the second plurality of sub-exposures having a respective duration;
discarding charge accumulated in the first pixel in a plurality of reset periods, a reset period occurring after each sub-exposure in the first plurality of sub-exposures,
wherein a duration of at least one sub-exposure in the first plurality of sub-exposures is less than a duration of at least one reset period in the plurality of reset periods, and wherein the duration of at least one of the first plurality of sub-exposures is shorter than at least one of the second plurality of sub-exposures.

34. The method of claim 33, wherein all of the first plurality of sub-exposures have substantially a first duration and all of the second plurality of sub-exposures have substantially a second duration, the first duration being shorter than the second duration.

35. The method of claim 33, wherein the first color channel is clear or green, and the second channel is red or blue.

36. The method of claim 33, wherein a third exposure of a third pixel associated with a third color channel is not partitioned.

37. The method of claim 36, wherein the third color channel is red.

38. The method of claim 36, wherein the respective durations of the first and second plurality of sub-exposures is determined based on the relative sensitivity of the first and second color channels to the third color channel.

39. The method of claim 33, further comprising analog summing charge accumulated in each of the first plurality of sub-exposures in a first storage node and analog summing charge accumulated in each of the second plurality of sub-exposures in a second storage node.

* * * * *